United States Patent
Wada et al.

[11] Patent Number: 5,468,724
[45] Date of Patent: Nov. 21, 1995

[54] HIGH TEMPERATURE OXIDE SUPERCONDUCTOR

[75] Inventors: Takahiro Wada; Shin-ichi Koriyama; Takeshi Sakurai; Nobuo Suzuki; Takayuki Miyatake; Hisao Yamauchi; Naoki Koshizuka; Shoji Tanaka, all of Tokyo, Japan

[73] Assignees: International Superconductivity Technology Center, Tokyo; Matsushita Electric Industrial Co., Ltd., Kadoma; Kyocera Corporation, Kyoto; Mitsubishi Metal Corporation; The Tokyo Electric Power Company, Incorporated, both of Tokyo; Kabushiki Kaisha Kobe Seiko Sho, Kobe, all of Japan

[21] Appl. No.: 68,587

[22] Filed: May 27, 1993

Related U.S. Application Data

[63] Continuation of Ser. No. 569,971, Aug. 20, 1990, abandoned.

[30] Foreign Application Priority Data

Aug. 18, 1989 [JP] Japan .................. 1-213726
Aug. 18, 1989 [JP] Japan .................. 1-213727
Oct. 30, 1989 [JP] Japan .................. 1-282701

[51] Int. Cl.$^6$ ............................ H01B 12/00; H01L 39/12
[52] U.S. Cl. .................... 505/125; 505/100; 505/780; 505/779; 252/518; 252/521
[58] Field of Search ........................ 505/1, 780, 742, 505/779; 252/518, 521; 501/123, 126, 152; 423/596, 604

[56] References Cited

U.S. PATENT DOCUMENTS 5,010,054  4/1991  Johansen et al. .................. 505/1
5,024,992  6/1991  Morris .................................. 505/1

FOREIGN PATENT DOCUMENTS 1-9850    1/1989  Japan .
1-111766  4/1989  Japan .

OTHER PUBLICATIONS

Wada et al., "Preparation and Properties of Superconducting $Y(Ba_{1-x}Sr_x)_2Cu_4O_8$" *Physical Rev. B* vol. 41, No. 6, 1 Jun. 1990.

Miyatake, "Tc Increased to 90K in $YBa_2Cu_4O_8$ by Ca Doping", *Nature* vol. 341, 7 Sep. 1989, pp. 41–42.

Tokiwa et al, "Crystal Structure and Superconductivity Controlled . . . in $Y_{1-x}Ca_xBa_2Cu_3O_4$ and $YBa_{2-x}La_xCu_3O_y$", *JJAP* 27(6), Jun. 1988, pp. L1009–L1012.

Wada et al, "Annealing Effect of High–Tc Superconducting $Y(Ba_{1-x}Sr)_2Cu_3O_{7-y}$ Ceramics," *JJAP* 26(9), Sep. 1987, pp. L1475–L1477.

Morris et al, "Eight New High–Temperature Superconductors with the 1:2:4 Structure," *Physical Review*, 39(10), 1 Apr. 1989, pp. 7347–7350.

(List continued on next page.)

*Primary Examiner*—Paul Lieberman
*Assistant Examiner*—M. Kopec
*Attorney, Agent, or Firm*—Oblon, Spivak, McClelland, Maier, & Neustadt

[57] ABSTRACT

Disclosed herein are high-temperature oxide superconductors of $RBa_2Cu_4O_8$ type, with Ba partly replaced by Sr or Ca, or with R and Ba partly replaced by Ca and Sr, respectively, as represented by the chemical composition formula of $R(Ba_{1-y}Sr_y)_2Cu_4O_8$ or $R(Ba_{1-z}Ca_z)_2Cu_4O_8$ or $(R_{1-x}Ca_x)(Ba_{1-y}Sr_y)_2Cu_4O_8$. They exhibit superconductivity at high temperatures. Especially, the last one exhibits superconductivity at a higher temperature than the former two. All of them can be made with a less amount of Ba as a deleterious substance, and the first two have improved sinterability. The best results are obtained when they are produced by the process involving the hot hydrostatic pressure treatment of the mixture of raw materials at 850°–1100° C. in an atmosphere composed of an inert gas and oxygen. The process permits a wider selection of Ba raw materials.

2 Claims, 21 Drawing Sheets

OTHER PUBLICATIONS

Morris et al, "Stablity of 124, 123 and 247 Superconductors," *Physica C* vol. 159, 1989, pp. 287–294.

Clarke, "The Development of High–Tc Ceramic Superconductors: An Introduction," *Adv. Cer. Mat.* vol. 2, No. 3B, Jul. 20, 1987, pp. 273–292.

K. Shibutani et al, "Bulk Synthesis of $Ln_{1-x}Ca_xBa_2Cu_4O_8$(Ln=Y,Ho) by the Oxygen–Hip Technique," Physica C 167, pp. 102–106 (1990).

R. G. Buckley et al, "Calcium–Substituted Superconducting $RBa_2Cu_4O_8$ with $T_c$~90K Prepared at One Atmosphere," Physica C 165, pp. 391–396 (1990).

5,468,724

HIGH TEMPERATURE OXIDE SUPERCONDUCTOR

This application is a continuation of application Ser. No. 07/569,971, filed on Aug 20, 1990, now abandoned.

BACKGROUND OF THE INVENTION

1. Field of the Invention

The present invention relates to a high-temperature oxide superconductor which has a superconducting transition temperature (referred to as $T_c$) higher than the boiling point of liquid nitrogen and is less liable to the variation of $T_c$ due to the liberation of oxygen that takes place during fabrication at a high temperature.

2. Description of the Prior Art

Among the known typical oxide superconductors having a $T_c$ higher than the boiling point of liquid nitrogen is $RBa_2Cu_3O_7$ of three-layer perovskite structure which has a $T_c$ of 90 K. (R denotes Y or at least one element selected from the lanthanoid rare earth elements.) [*Appl. Phys. Lett.* Vol. 51 (1987) P57]

Unfortunately, the above-mentioned oxide superconductor has the property that oxygen atoms as the constituent members are liable to get out of it when it is affected by heat during fabrication. For this reason, the oxygen content in the superconductor varies depending on the heating conditions for fabrication. The variation of oxygen content brings about the orthorhombic-tetragonal phase transition, which in turn causes the $T_c$ to vary over a broad range from 0 K to 90 K. [*Phys. Rev.* B36 (1987) P5719]

For example, $RBa_2Cu_3O_7$ powder becomes deteriorated in superconductivity due to the partial loss of oxygen atoms which occurs during the sintering heat treatment in the production of a superconducting wire by the silver-sheath wire drawing method. This method involves the steps of filling the oxide semiconductor powder in a silver pipe, working the silver pipe into a wire by cold drawing, and sintering the powder at 800°–900° C.

In contrast with the above-mentioned oxide superconductor, there is known another oxide superconductor of $RBa_2Cu_4O_8$ type, which has the double-layered Cu—O chains instead of the single-layered Cu—O chains in the $RBa_2Cu_3O_7$-type crystal structure. It has a stable chemical structure, retaining oxygen atoms until it is heated to about 850° C. Moreover, it has the $T_c$ in the neighborhood of 80 K, which is higher than the boiling point of liquid nitrogen. Thus it is regarded as an important substance from the standpoint of practical use.

The oxide superconductor of $RBa_2Cu_4O_8$ type can be produced by one of the following two methods which have been proposed so far.

(1) A method involving the heat treatment of a calcined powder in a high-pressure atmosphere of pure oxygen. (E.g., at 930° C. for 8 hours under an oxygen pressure of 100 atm) [High-pressure oxygen method; $T_c$=81 K, *Nature* 336 (1988) P660–662, or *Phys. Rev.* B39 (1988) p7347–7350]

(2) A method involving the heat treatment of a mixture of a calcined powder with a catalyst (such as sodium carbonate) in an oxygen stream for a long time. (E.g., at 800° C. for 72 hours) [Normal-pressure method; $T_c$=77 K, *Nature* 338 (1989) P328–330]

Unfortunately, the superconductor compound of R-Ba-Ca—O type presents a problem associated with its production process because it contains a large portion of Ba and its synthesis needs a large amount of Ba compounds such as BaO, $BaCO_3$, and $Ba(NO_3)_2$, which are deleterious substances. (For example, the Ba content in $YBa_2Cu_4O_8$ is 13.33 mol %.) Another disadvantage of this oxide superconductor is that it cannot be made with cheap $BaCO_3$ by the above-mentioned methods because $BaCO_3$ decomposes at 1000° C. or above under normal pressure, whereas the reaction in the above-mentioned methods takes place at a comparatively low temperature. Therefore, it has to be made with an expensive compound, such as $Ba(NO_3)_2$, in place of $BaCO_3$.

In addition, the present inventors' investigation revealed that an oxide of $YBa_2Cu_4O_8$ type is poor in sinterability and is liable to give a sintered body having a rather low density. The sintered body of low density has a low critical current density as a matter of course.

OBJECT OF THE INVENTION

It is an object of the present invention to provide an oxide superconductor which has a high density, is almost free of oxygen absorption and liberation at high temperatures, exhibits good heat stability during fabrication of any kind, and can be made with a less amount of barium as a deleterious substance.

It is another object of the present invention to provide an oxide superconductor which can be made with a Ba raw material in great variety.

These and other objects of the invention will become more apparent in the detailed description and examples which follow.

SUMMARY OF THE INVENTION

The present invention provides an oxide superconductor of $RBa_2Cu_4O_8$ type which is represented by the chemical composition formula of $R(Ba_{1-y}Sr_y)_2Cu_4O_8$ ($0.001 \leq y \leq 0.6$) or $R(Ba_{1-z}Ca_z)_2Cu_4O_8$ ($0.001 \leq z \leq 0.2$), where R denotes Y or at least one element selected from the lanthanum series elements. This oxide superconductor is characterized by that Ba in $RBa_2Cu_4O_8$ is partly replaced with Sr or Ca. This leads to the reduction of Ba content and improved sinterability as compared with the conventional oxide superconductor of $RBa_2Cu_4O_8$ type.

In the present invention, a part of R also may be substituted with Ca in an amount of lower than 30% when Ba is partially substituted with Sr. Such a superconductor is represented by the chemical composition formula of $(R_{1-x}Ca_x)(Ba_{1-y}Sr_y)_2Cu_4O_8$ ($0 \leq x \leq 0.3$ and $0.001 \leq y \leq 0.6$), where R denotes Y or at least one element selected from the lanthanide series elements. This oxide superconductor is characterized by that R and Ba in $RBa_2Cu_4O_8$ are partly replaced with Ca and Sr, respectively. This leads to the reduction of Ba content and permits a wide selection of raw materials.

DETAILED DESCRIPTION OF THE INVENTION

The present inventors carried out their researches to improve the sinterability of the oxide superconductor of $RBa_2Cu_4O_8$ type. As the result, it was found that the object is achieved when Ba in the oxide superconductor is partly replaced by Sr or Ca. The thus obtained oxide superconductor contains a reduced amount of Ba as the chemical composition (after replacement) indicates. This is an important point in the present invention.

Figure 2:
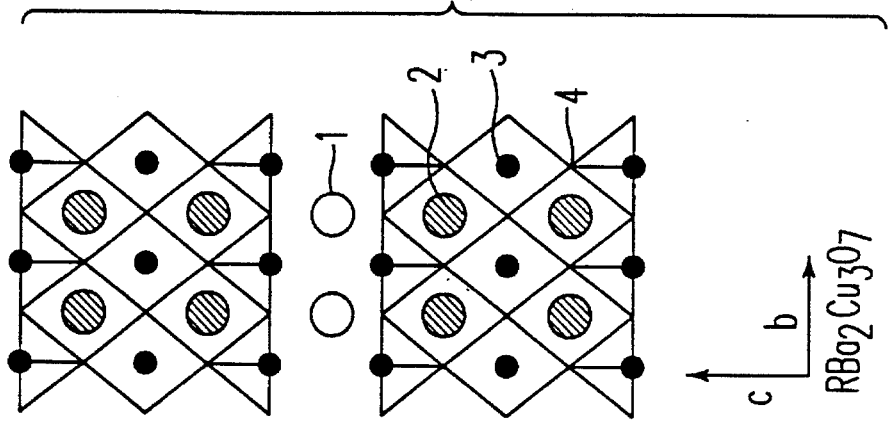
FIG. 2 is a schematic drawing illustrating the crystal structure of $RBa_2Cu_3O_7$.
Figure 1:
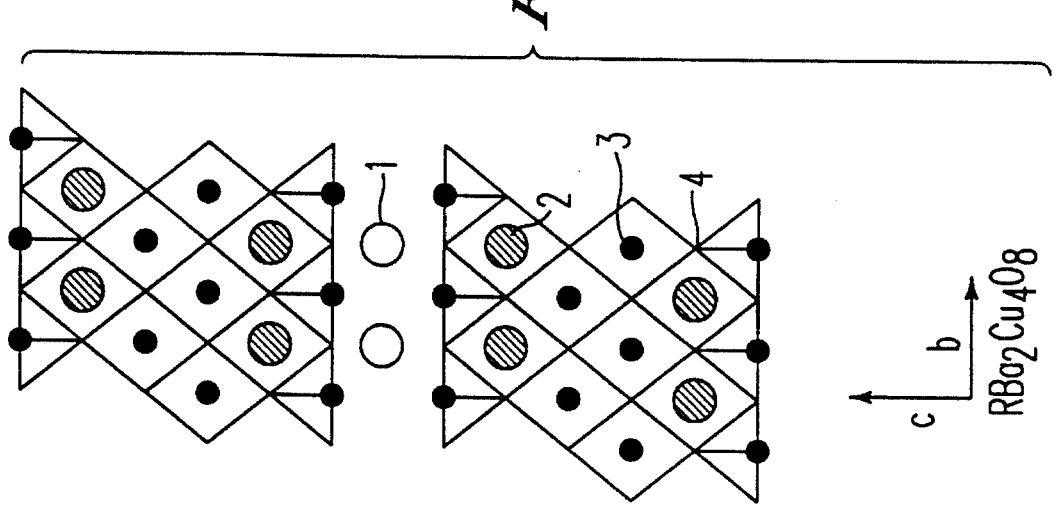
FIG. 1 is a schematic drawing illustrating the crystal structure of $RBa_2Cu_4O_8$.

The oxide superconductor pertaining to the present invention has the basic structure of $RBa_2Cu_4O_8$ which is schematically shown in FIG. 1, whereas the conventional oxide superconductor has the basic structure of $RBa_2Cu_3O_7$ which is schematically shown in FIG. 2. In FIGS. 1 and 2, the reference numerals 1, 2, 3, and 4 denote R, Ba, Cu, and O arranged on the intersecting point of lines, respectively. The crystal structure of $RBa_2Cu_4O_8$ in FIG. 1 has the Cu—O chains in two layers, whereas that of $RBa_2Cu_3O_7$ in FIG. 2 has the Cu—O chains in one layer.

The oxide superconductor pertaining to the present invention is represented by the chemical composition formula of $R(Ba_{1-y}Sr_y)_2Cu_4O_8$ or $R(Ba_{1-z}Ca_z)_2Cu_4O_8$, which is derived when Ba in $RBa_2Cu_4O_8$ is partly replaced by Sr or Ca.

The oxide superconductor of the present invention represented by $R(Ba_{1-y}Sr_y)_2Cu_4O_8$ or $R(Ba_{1-z}Ca_z)_2Cu_4O_8$ has the $T_c$ higher than 80 K and can be easily sintered into a sintered body having a porosity lower than 10%, whereas the oxide superconductor represented by $RBa_2Cu_4O_8$ (as the base material) has the $T_c$ of 80 K and is difficult to sinter.

As the result of their investigation into a more useful oxide superconductor, the present inventors have proposed an oxide of $(R_{1-x}Ca_x)Ba_2Cu_4O_8$ type, which is a derivative of the oxide superconductor of $RBa_2Cu_4O_8$ type, with R partly replaced by Ca. (See Japanese Patent Application No. 176472/1989.) The oxide superconductor of $(R_{1-x}Ca_x)Ba_2Cu_4O_8$ type has the $T_c$ which is much higher than the boiling point of liquid nitrogen on account of the partial replacement of R by Ca. In addition, it is stable at high temperatures (even when heated at about 850° C.) with no loss of oxygen.

After their continued investigation, the present inventors found that better results can be obtained when the oxide superconductor of $RBa_2Cu_4O_8$ type has not only R partly replaced by Ca but also Ba partly replaced by Sr. The resulting oxide superconductor contains a less amount of Ba as a deleterious substance. Moreover, it has the higher $T_c$ than the oxide superconductor with Ba alone partly replaced by Sr. This finding is the basis on which the present invention was completed.

The oxide superconductor pertaining to the present invention is represented by the chemical composition formula of $(R_{1-x}Ca_x)(Ba_{1-y}Sr_y)_2Cu_4O_8$, which is derived when R and Ba in $RBa_2Cu_4O_8$ (shown in FIG. 1) are partly replaced by Ca and Sr, respectively.

The oxide superconductor of the present invention represented by $(R_{1-x}Ca_x)(Ba_{1-y}Sr_y)_2Cu_4O_8$ (where $0<x\leq 0.3$ and $0.001\leq y\leq 0.6$) contains a reduced amount (down to 5.33 mol %) of Ba, whereas the conventional oxide superconductor represented by $RBa_2Cu_4O_8$ (where R=Y) having the $T_c$ of 80K contains as much Ba as 13.33 mol % which is supplied from barium nitrate.

The oxide superconductor of the present invention can be produced by the HIP treatment method (mentioned later), which permits Ba to be supplied from barium carbonate. Thus the present invention permits a wider selection of raw materials, which leads to the economical production of oxide superconductors having the superconducting transition temperature in the neighborhood of 80 K.

The results of thermogravimetry indicate that the oxide superconductors pertaining to the present invention remain stable without oxygen absorption or liberation. Therefore, they can be made into a stable, compactly sintered superconducting wire by the silver sheath method without any adverse effect on superconductivity in the final sintering step.

The oxide superconductors pertaining to the present invention can be given a higher density than before by the high-temperature molding that employs a binder. This is because they are stable at high temperatures and hence can be freed from the binder by heating up to about 850° C. By contrast, the conventional oxide superconductor ($RBa_2Cu_3O_7$) cannot be freed from the binder by heating because it permits the liberation of oxygen atoms upon heating above 400° C. The higher density leads to the improvement of critical current density. In addition, the oxide superconductors pertaining to the present invention can be made into a thin film which is stabler to enviroments and has a stabler superconducting transition temperature than a thin film of the conventional oxide superconductor of $RBa_2Cu_3O_7$ type, which is easily deteriorated in the air at normal temperature on account of its great specific surface area.

The oxide superconductor of the present invention can be produced by several methods including sputtering and coprecipitation. The most effective method is by the hot hydrostatic treatment (HIP treatment) of a powder mixture of R, Ca, Sr, Ba, Cu, and O (as raw materials) in an atmosphere composed of an inert gas and oxygen at 850°–1100° C.

Since the atmosphere for the HIP treatment is composed of an inert gas and oxygen, the total pressure of the atmosphere can be much higher so that the partial pressure of oxygen is equal to the pressure (say 200 atm) required in the case where the atmosphere is pure oxygen. The atmosphere composed of an inert gas and oxygen in a molar ratio of 1:1 may have a total pressure of 400 atm, and with a molar ratio of 4:1, the total pressure can be raised to 1000 atm. It is considered that the atmosphere under high pressure increases the diffusion of Cu atoms and promotes the formation of the oxide superconductor of $RBa_2Cu_4O_8$ type. The HIP treatment is safer than the conventional process that employs high-pressure pure oxygen.

The HIP treatment should be performed at 850° C. or above so as to promote the formation of the oxide superconductor of the present invention, while suppressing the formation of the oxide of $RBa_2Cu_3O_7$ type. The HIP treatment at a temperature beyond the upper limit of 1100° C. forms a mixed phase containing $R_2Ba_4Cu_7O_8$.

EXAMPLES

Example 1

Mixtures each having a chemical composition of $Y(Ba_{1-y}Sr_y)_2Cu_4O_8$ (where y=0, 0.01, 0.1, 0.2, 0.3, 0.4, 0.5, 0.6, or 0.7) were prepared from $Y_2O_3$, $Ba(NO_3)_2$, CuO, and $Sr(NO_3)_2$ (in powder form having a purity of 99.9%). The mixture was calcined at 850° C. for 24 hours in oxygen. The calcined product was crushed and molded into a rectangular prism. The molded material underwent preliminary sintering at 800° C. for 5 hours in oxygen. The sintered material underwent heat treatment in an atmosphere composed of 80% of argon and 20% of oxygen under a pressure of 1000 atm. The heat treatment consisted of heating up to 960° C. at a rate of 200° C./hr and keeping this temperature for 6 hours, and further heating up to 1050° C. at a rate of 200° C./hr and keeping this temperature for another 6 hours. The heat treatment was followed by cooling down to 300° C. at a rate of 200° C./hr. The atmosphere was depressurized to 1 atm and the heat-treated material was discharged. The heat-treated material was crushed again and molded. The molded material was sintered at 800° C. for 10 hours in oxygen.

Figure 3:
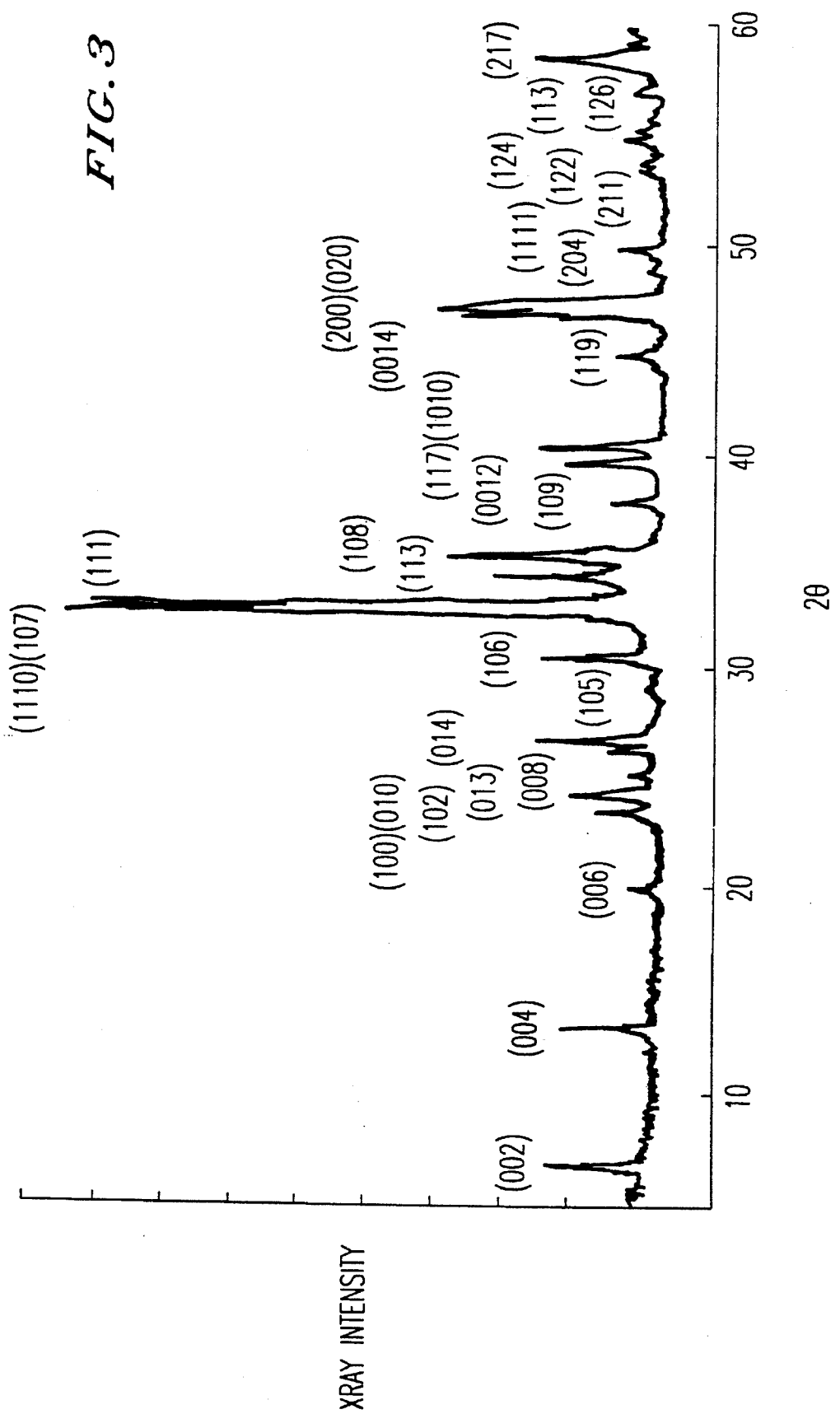
FIG. 3 is an X-ray diffraction pattern (powder method) of a sample in Example 1 which is represented by $Y(Ba_{1-y}Sr_y)_2Cu_4O_8$ (where y=0.3).

The thus obtained sintered body (sample) was tested for phase by X-ray diffractometry (powder method). It was found that the principal constituent of the sample has the crystal structure of $YBa_2Cu_4O_8$ type. The sample in which y=0.3 gave an X-ray diffraction pattern (by powder method) as shown in FIG. 3. This pattern has the peaks attributable to the $YBa_2Cu_4O_8$ structure, which are indicated by indices. This sample is composed of a single superconducting phase.

The samples obtained in this example have the phases as shown in Table 1. The samples in which y is 0 to 0.6 are composed of a single phase of $Y(Ba_{1-y}Sr_y)_2Cu_4O_8$, whereas the sample in which y is 0.7 contains a second phase.

The samples were tested for superconductivity by measuring their resistance. The results are shown in Table 1 and FIG. 4. In Table 1, $T_c^{on}$ denotes the onset temperature for superconductivity transition from normal conductivity; $T_c^{R=0}$ denotes the temperature at which the resistance decreases to zero; and $\rho^{300\ K}$ denotes the resistivity at 300 K.

TABLE 1

| y | Crystal phase | $T_c^{on}$ (K) | $T_c^{R=0}$ (K) | $\rho^{300K}$ (×10$^{-3}$ Ω · cm) | Porosity (%) | Remarks |
|---|---|---|---|---|---|---|
| 0.0 | Superconducting single phase | 80 | 75 | 7.2 | 39 | Comparative Example |
| 0.001 | Superconducting single phase | 81 | 76 | 5.1 | 22 | Example |
| 0.01 | Superconducting single phase | 82 | 77 | 3.6 | 15 | Example |
| 0.1 | Superconducting single phase | 82 | 78 | 1.2 | 9 | Example |
| 0.2 | Superconducting single phase | 82 | 77 | 1.6 | 7 | Example |
| 0.3 | Superconducting single phase | 82 | 76 | 1.5 | 5 | Example |
| 0.4 | Superconducting single phase | 82 | 76 | 1.3 | 8 | Example |
| 0.5 | Superconducting single phase | 81 | 76 | 0.9 | 13 | Example |

TABLE 1-continued

| y | Crystal phase | $T_c^{on}$ (K) | $T_c^{R=0}$ (K) | $\rho^{300K}$ (×10⁻³ Ω·cm) | Porosity (%) | Remarks |
|---|---|---|---|---|---|---|
| 0.6 | Superconducting single phase | 81 | 76 | 2.1 | 19 | Example |
| 0.7 | Superconducting phase plus impurity phase | 81 | 71 | 8.4 | 24 | Comparative Example |

Figure 4:
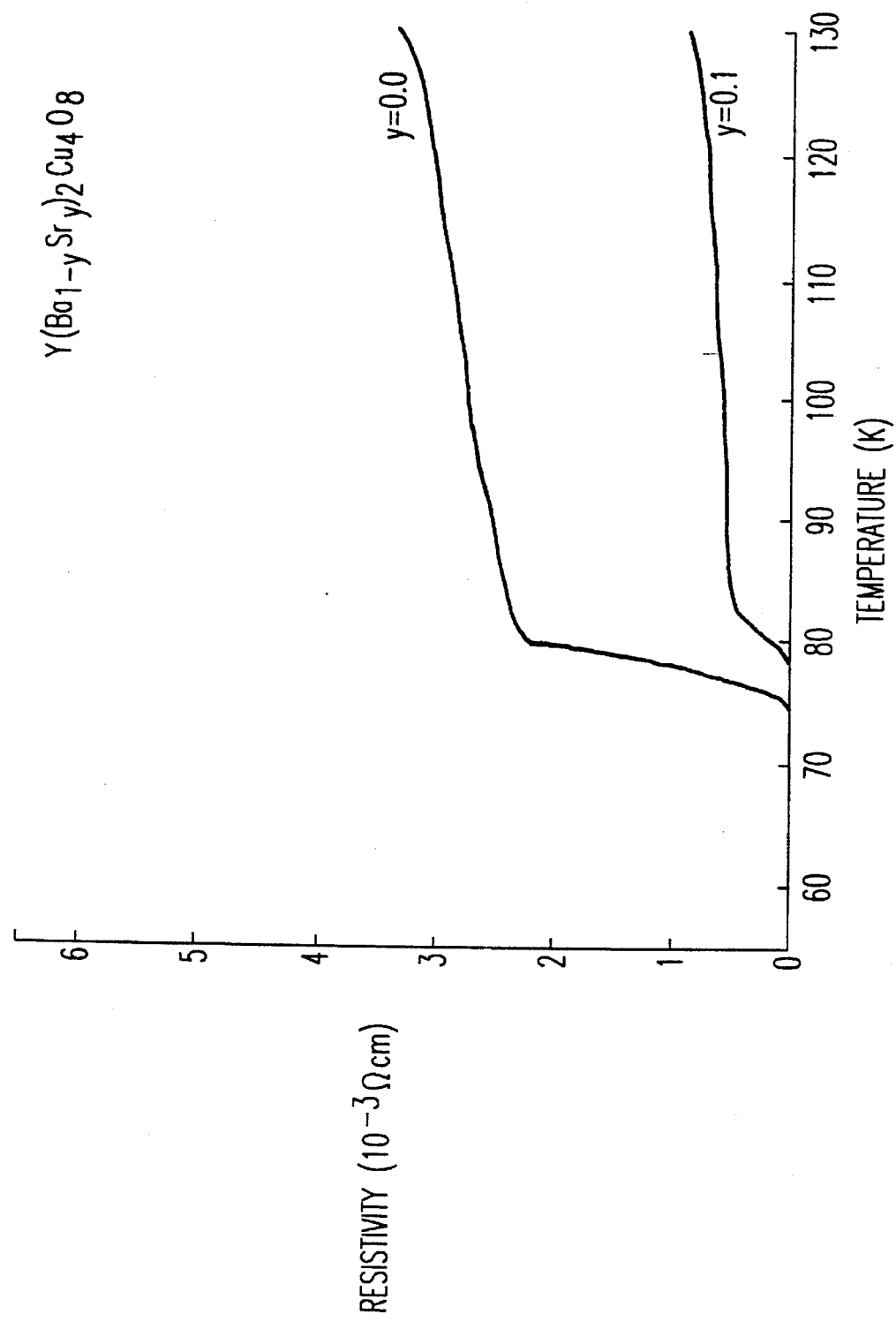
FIG. 4 is a graph showing the resistance-temperature characteristics of a sample in Example 1 which is represented by $Y(Ba_{1-y}Sr_y)_2Cu_4O_8$.

It is noted from Table 1 and FIG. 4 that all the oxide superconductors $Y(Ba_{1-y}Sr_y)_2Cu_4O_8$ pertaining to the present invention have the $T_c$ of 80 K. level, which is higher than the boiling point (77 K.) of liquid nitrogen. It is also noted that the samples decrease in resistance (at room temperature) in proportion to the Sr content (y). Those samples having a low resistance at room temperature are expected to have a high critical current density. The sample in which y is 0.5 has the lowest resistance at room temperature. The resistance increases in proportion to the value of y when y is greater than 0.6, and when y is 0.7, the resistance is higher than that when y is 0.

The samples were tested for porosity by observing polished samples under an optical microscope. The results are shown in Table 1. It is noted that the porosity decreases in proportion to the value of y, reaching the minimum of about 5% when y is 0.3, and the porosity is not improved even when the value of y increases further.

The results of X-ray diffractometry and the measurements of porosity as mentioned above suggest that the decrease of resistance (at room temperature) in proportion to the value of y is due to the formation of a solid solution by partial substitution of Sr for Ba in $YBa_2Cu_4O_8$. Consequently, according to the present invention, the value of y should be in the range of 0.001 to 0.6.

Figure 5:
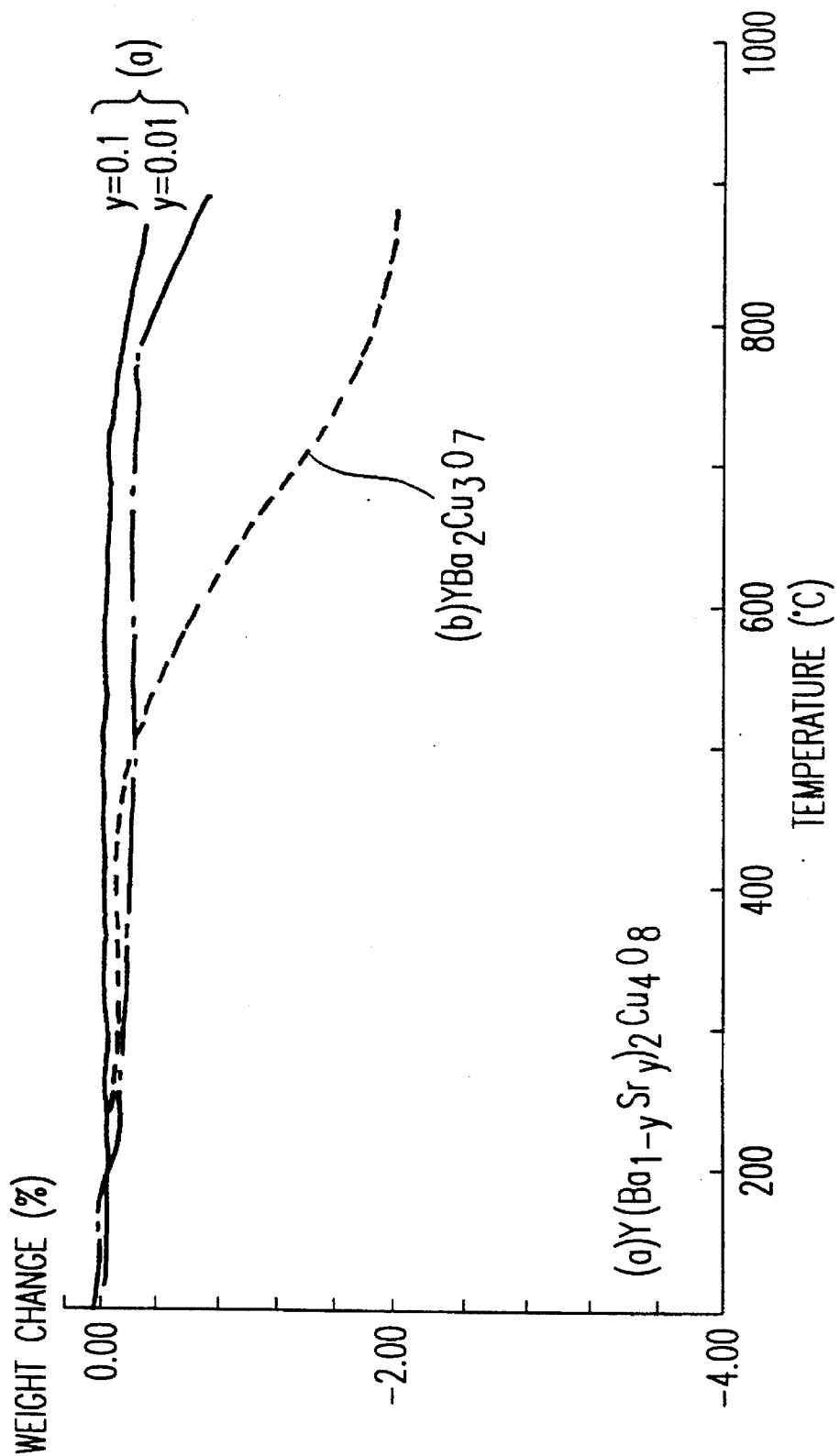
FIG. 5 is a graph showing the results of thermogravimetry for a sample in Example 1 which is represented by $Y(Ba_{1-y}Sr_y)_2Cu_4O_8$.

Thermogravimetry performed on the samples in which the value of y is 0.1 and 0.01 gave the results as shown in FIG. 5(a). It is noted that the samples remain unchanged in weight over the range from normal temperature to 850° C. and decrease in weight over the range from 850° C. to 900° C. These results suggest that the samples remain stable up to a temperature as high as 850° C. without absorption and liberation of oxygen. By contrast, the conventional superconductor $YBa_2Cu_3O_7$ loses a large amount of oxygen at 400° C. to 800° C., as shown in FIG. 5(b).

It will be understood from the foregoing that the superconductor $YBa_2Cu_4O_8$ as the base material is difficult to sinter and gives a sintered body having a porosity higher than 30%, whereas the samples in this example which are specified by the composition of $Y(Ba_{1-y}Sr_y)_2Cu_4O_8$ (where $0.001 \leq y \leq 0.6$) have the $T_c$ higher than 80 K. and give sintered bodies having a low porosity. In addition, these samples have a low electric resistance at room temperature and remain stable up to 850° C. without absorption and liberation of oxygen.

Example 2

Mixtures each having a chemical composition of $Ho(Ba_{1-y}Sr_y)_2Cu_4O_8$ (where y=0, 0.01, 0.1, 0.2, 0.3, 0.4, 0.5, 0.6, or 0.7) were prepared from $Ho_2O_3$, $Ba(NO_3)_2$, CuO, and $Sr(NO_3)_2$ (in powder form having a purity of 99.9%). The mixture was calcined at 850° C. for 24 hours in oxygen. The calcined product was crushed and molded into a rectangular prism. The molded material underwent preliminary sintering at 800° C. for 5 hours in oxygen. The sintered material underwent heat treatment in an atmosphere composed of 80% of argon and 20% of oxygen under a pressure of 1000 atm. The heat treatment consisted of heating up to 950° C. at a rate of 200° C./hr and keeping this temperature for 6 hours, and further heating up to 1050° C. at a rate of 200° C./hr and keeping this temperature for another 6 hours. The heat treatment was followed by cooling down to 300° C. at a rate of 200° C./hr. The atmosphere was depressurized to 1 atm and the heat-treated material was discharged. The heat-treated material was crushed again and molded. The molded material was sintered at 800° C. for 20 hours in oxygen.

Figure 6:
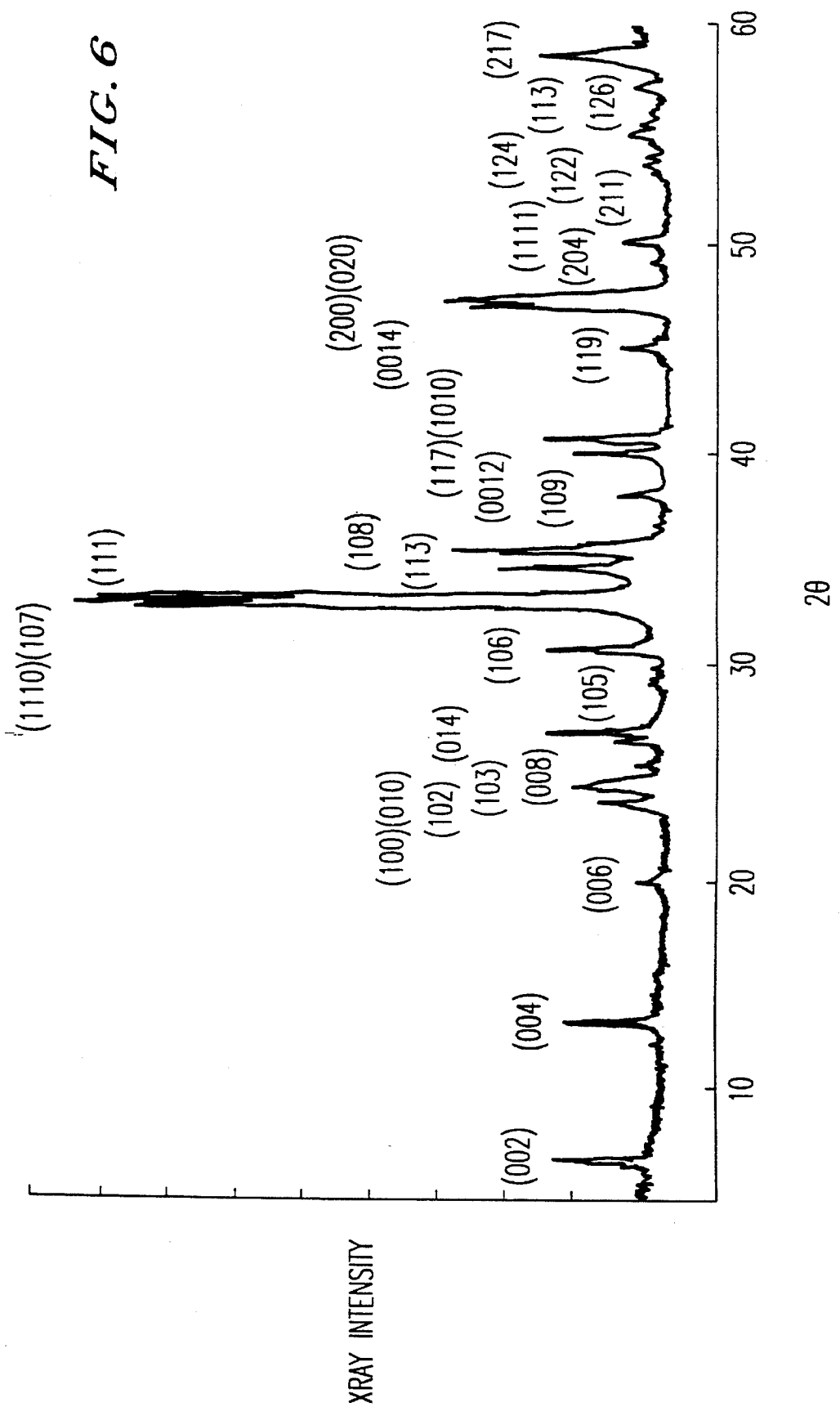
FIG. 6 is an X-ray diffraction pattern (powder method) of a sample in Example 2 which is represented by $Ho(Ba_{1-y}Sr_y)_2Cu_4O_8$ (where y=0.3).

The thus obtained sintered body (sample) was tested for phase by X-ray diffractometry (powder method). It was found that the principal constituent of the sample has the crystal structure of $RBa_2Cu_4O_8$ type. The sample in which y=0.1 gave an X-ray diffraction pattern (by powder method) as shown in FIG. 6. This pattern has the peaks attributable to the $RBa_2Cu_4O_8$ structure, which are indicated by indices. This sample is composed of a single superconducting phase.

The samples obtained in this example have the phases as shown in Table 2. The samples in which y is 0 to 0.6 are composed of a single phase of $Ho(Ba_{1-y}Sr_y)_2Cu_4O_8$, whereas the sample in which y is 0.7 contains a second phase.

The samples were tested for superconductivity by measuring their resistance. The results are shown in Table 2 and FIG. 7.

TABLE 2

| y | Crystal phase | $T_c^{on}$ (K) | $T_c^{R=0}$ (K) | $\rho^{300K}$ (×10⁻³ Ω·cm) | Porosity (%) | Remarks |
|---|---|---|---|---|---|---|
| 0.0 | Superconducting single phase | 80 | 75 | 7.2 | 39 | Comparative Example |
| 0.001 | Superconducting single phase | 81 | 78 | 5.1 | 22 | Example |
| 0.01 | Superconducting single phase | 81 | 78 | 3.6 | 15 | Example |
| 0.1 | Superconducting single phase | 82 | 79 | 3.1 | 9 | Example |

TABLE 2-continued

| y | Crystal phase | $T_c^{on}$ (K) | $T_c^{R=0}$ (K) | $\rho^{300K}$ ($\times 10^{-3}$ Ω · cm) | Porosity (%) | Remarks |
|---|---|---|---|---|---|---|
| 0.2 | Superconducting single phase | 82 | 78 | 2.7 | 5 | Example |
| 0.3 | Superconducting single phase | 82 | 78 | 1.9 | 5 | Example |
| 0.4 | Superconducting single phase | 82 | 77 | 1.6 | 6 | Example |
| 0.5 | Superconducting single phase | 81 | 76 | 1.1 | 7 | Example |
| 0.6 | Superconducting single phase | 81 | 76 | 4.2 | 8 | Example |
| 0.7 | Superconducting phase plus impurity phase | 80 | 72 | 0.9 | 8 | Comparative Example |

Figure 7:
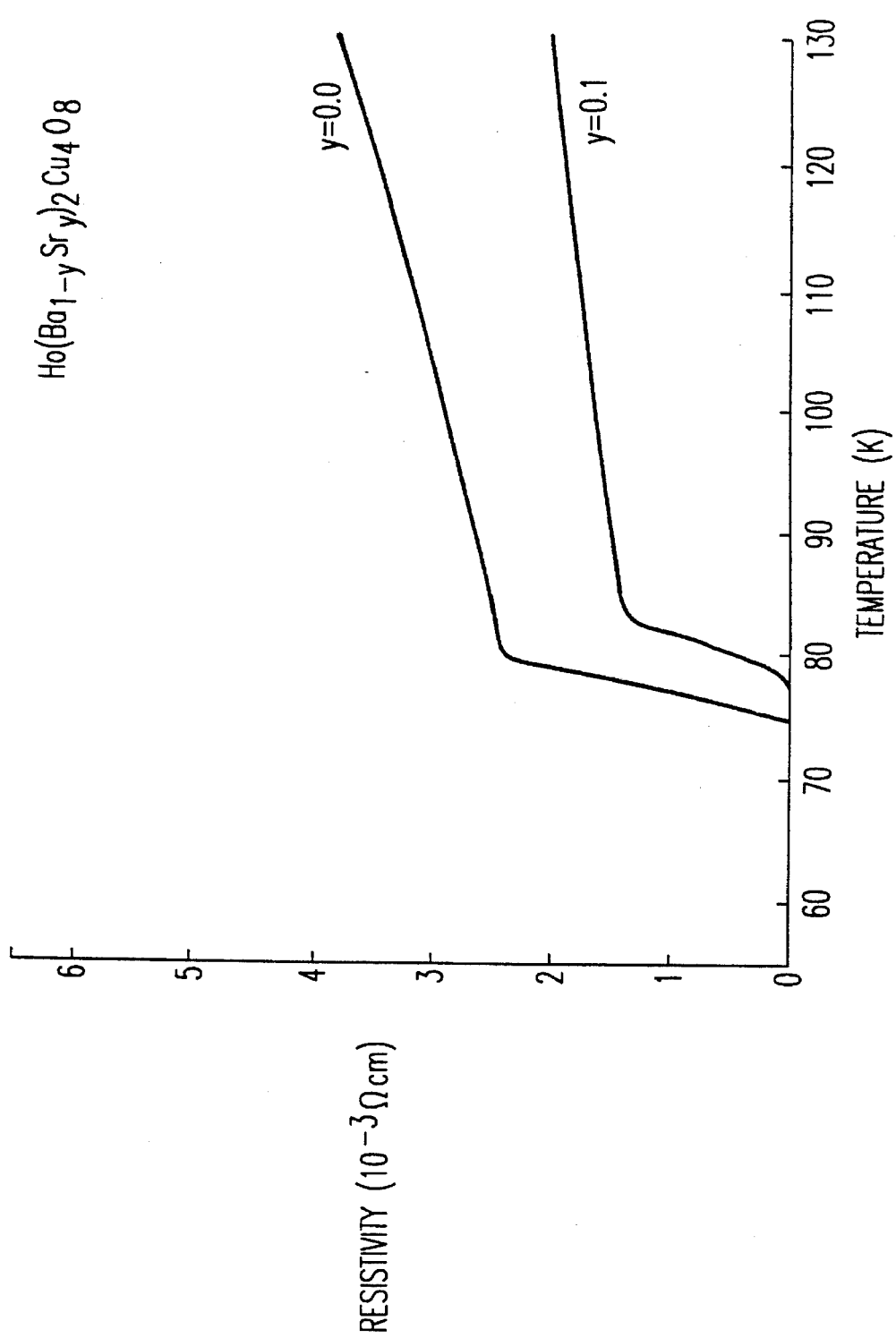
FIG. 7 is a graph showing the resistance-temperature characteristics of a sample in Example 2 which is represented by $Ho(Ba_{1-y}Sr_y)_2Cu_4O_8$.

It is noted from Table 2 and FIG. 7 that all the oxide superconductors $Ho(Ba_{1-y}Sr_y)_2Cu_4O_8$ pertaining to the present invention have the $T_c$ of 80 K level, which is higher than the boiling point (77 K) of liquid nitrogen. It is also noted that the samples decrease in resistance (at room temperature) in proportion to the Sr content (y). Those samples having a low resistance at room temperature are expected to have a high critical current density. The sample in which y is 0.5 has the lowest resistance at room temperature. The resistance increases in proportion to the value of y when y is greater than 0.6, and when y is 0.7, the resistance is higher than that when y is 0.

The samples were tested for porosity by observing polished samples under an optical microscope. The results are shown in Table 2. It is noted that the porosity decreases in proportion to the value of y, reaching the minimum of about 5% when y is 0.3, and the porosity remains unchanged even when the value of y increases further.

The results of X-ray diffractometry and the measurements of porosity as mentioned above suggest that the decrease of resistance (at room temperature) in proportion to the value of y is due to the formation of a solid solution by partial substitution of Sr for Ba in $HoBa_2Cu_4O_8$.

Figure 8:
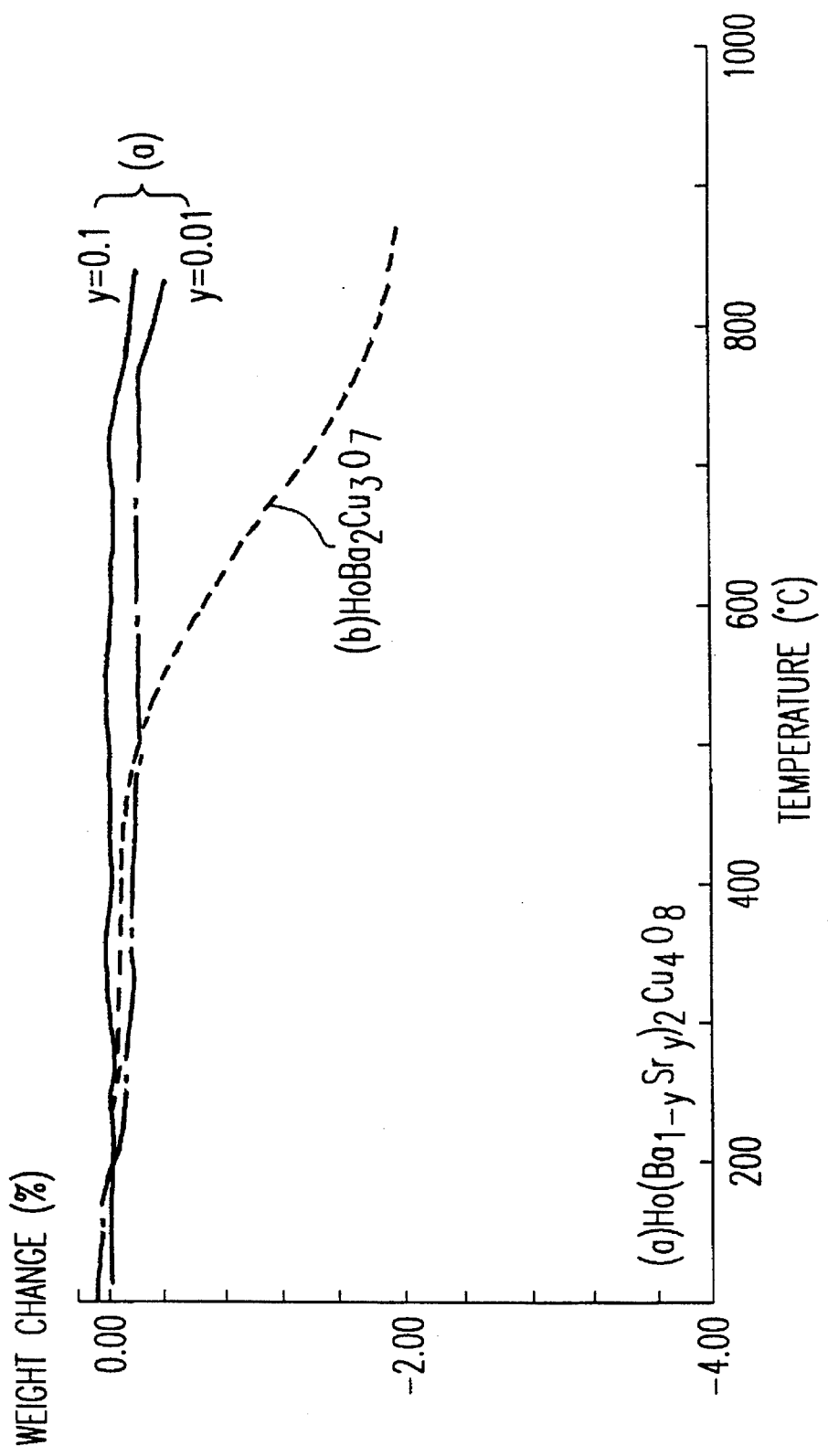
FIG. 8 is a graph showing the results of thermogravimetry for a sample in Example 2 which is represented by $Ho(Ba_{1-y}Sr_y)_2Cu_4O_8$.

Thermogravimetry performed on the samples in which the value of y is 0.1 and 0.01 gave the results as shown in FIG. 8(a). It is noted that the samples remain unchanged in weight over the range from normal temperature to 850° C. and decrease in weight over the range from 850° C. to 900° C. These results suggest that the samples remain stable up to a temperature as high as 850° C. without absorption and liberation of oxygen. By contrast, the conventional superconductor $HoBa_2Cu_3O_7$ loses a large amount of oxygen at 400° C. to 800° C., as shown in FIG. 8(b).

It will be understood from the foregoing that the superconductor $HoBa_2Cu_4O_8$ as the base material has the $T_c$ of 80 K and is difficult to sinter and gives a sintered body having a porosity higher than 30%, whereas the samples in this example which are specified by the composition of Ho $(Ba_{1-y}Sr_y)_2Cu_4O_8$ (where $0.001 \leq y \leq 0.6$) have the $T_c$ higher than 80 K. and give sintered bodies having a porosity lower than 22%. In addition, these samples have a low electric resistance at room temperature and remain stable up to 850° C. without the absorption and liberation of oxygen.

Example 3

Samples were prepared in the same manner as in Examples 1 except that Ho in Ho $(Ba_{1-y}Sr_y)_2CuO_4O_8$ was replaced by Nd, Sm, Eu, Gd, Dy, Er, Tm, Yb, or Lu, with the value of y fixed at 0.3. The samples were evaluated in the same manner as in Example 1. The results are shown in Table 3.

TABLE 3

| R | X-ray diffractometry | $T_c^{on}$ (K) | $T_c^{R=0}$ (K) | $\rho^{300K}$ ($\times 10^{-3}$ Ω · cm) | Porosity (%) | Remarks |
|---|---|---|---|---|---|---|
| Nd | Superconducting single phase | 83 | 78 | 0.89 | 8 | Example |
| Sm | Superconducting single phase | 82 | 78 | 0.82 | 7 | Example |
| Eu | Superconducting single phase | 82 | 76 | 0.76 | 7 | Example |
| Gd | Superconducting single phase | 82 | 76 | 0.72 | 6 | Example |
| Dy | Superconducting single phase | 81 | 76 | 0.68 | 5 | Example |
| Er | Superconducting single phase | 80 | 76 | 0.72 | 5 | Example |
| Tm | Superconducting single phase | 80 | 77 | 0.75 | 5 | Example |
| Yb | Superconducting phase plus impurity phase | 79 | 76 | 1.02 | 7 | Example |
| Lu | Superconducting phase plus | 79 | 76 | 1.11 | 9 | Example |

TABLE 3-continued

| R | X-ray diffractometry | $T_c^{on}$ (K) | $T_c^{R=0}$ (K) | $\rho^{300K}$ ($\times 10^{-3}$ Ω · cm) | Porosity (%) | Remarks |
| --- | --- | --- | --- | --- | --- | --- |
| | impurity phase | | | | | |

It is noted from Table 3 that the same effect is produced even when R is changed from Ho to any of Nd, Sm, Eu, Gd, Dy, Er, Tm, Yb, or Lu.

Example 4

Samples were prepared in the same manner as in Example 1 except that R in R $(Ba_{1-y}Sr_y)_2Cu_4O_8$ was replaced by Y and Ho in varied amounts, with the value of y fixed at 0.3. (In other words, the samples are represented by $(Y_{-p}Ho_p)(Ba_{0.7}Sr_{0.3})_2Cu_4O_8$, with the value of p varied.) The samples were evaluated in the same manner as in Example 1. The results are shown in Table 4.

TABLE 4

| P | X-ray diffractometry | $T_c^{on}$ (K) | $T_c^{R=0}$ (K) | $\rho^{300K}$ ($\times 10^{-3}$ Ω · cm) | Porosity (%) | Remarks |
| --- | --- | --- | --- | --- | --- | --- |
| 0.2 | Superconducting single phase | 83 | 76 | 1.4 | 5 | Example |
| 0.4 | Superconducting single phase | 83 | 78 | 1.2 | 5 | Example |
| 0.6 | Superconducting single phase | 82 | 78 | 1.0 | 4 | Example |
| 0.8 | Superconducting single phase | 82 | 78 | 1.7 | 5 | Example |

It is noted from Table 4 that the same effect is produced even when R is replaced by Y and Ho in varied amounts. It is expected that the same effect will be produced even when R is replaced by Y and two or more elements selected from lanthanide rare earth elements.

Example 5

Mixtures each having a chemical composition of $Y(Ba_{1-z}Ca_z)_2Cu_4O_8$ (where z=0, 0.01, 0.05, 0.5, 0.1, 0.15, 0.2, or 0.25) were prepared from $Y_2O_3$, $Ba(NO_3)_2$, CuO, and $CaCO_3$ (in powder form having a purity of 99.9%). The mixture was calcined at 850° C. for 24 hours in oxygen. The calcined product was crushed and molded into a rectangular prism. The molded material underwent preliminary sintering at 800° C. for 5 hours in oxygen. The sintered material underwent heat treatment in an atmosphere composed of 80% of argon and 20% of oxygen under a pressure of 1000 atm. The heat treatment consisted of heating up to 900° C. at a rate of 200° C./hr and keeping this temperature for 6 hours, and further heating up to 1020° C. at a rate of 200° C./hr and keeping this temperature for another 6 hours. The heat treatment was followed by cooling down to 300° C. at a rate of 200° C./hr. The atmosphere was depressurized to 1 atm and the heat-treated material was discharged. The heat-treated material was crushed again and molded. The molded material was sintered at 800° C. in oxygen.

Figure 9:
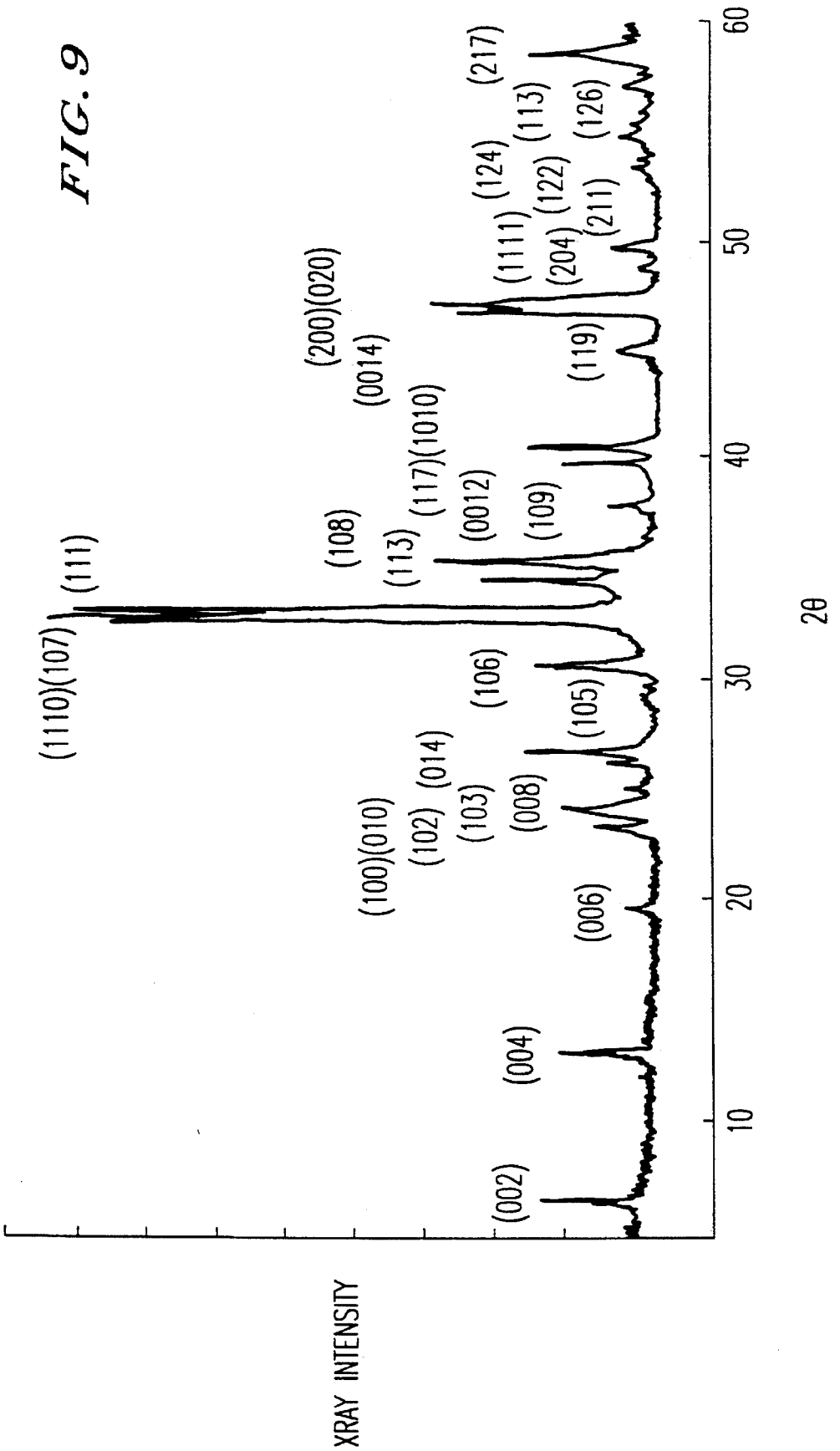
FIG. 9 is an X-ray diffraction pattern (powder method) of a sample in Example 5 which is represented by $Y(Ba_{1-z}Ca_z)_2Cu_4O_8$ (where z=0.1).

The thus obtained sintered body (sample) was tested for phase by X-ray diffractometry (powder method). It was found that the principal constituent of the sample has the crystal structure of $YBa_2Cu_4O_8$ type. The sample in which z=0.1 gave an X-ray diffraction pattern (by powder method) as shown in FIG. 9. This pattern has the peaks attributable to the $YBa_2Cu_4O_8$ structure, which are indicated by indices. This sample is composed of a single superconducting phase.

The samples obtained in this example have the phases as shown in Table 1. The samples in which z are 0 to 0.2 are composed of a single phase of $Y(Ba_{1-z}Ca_z)_2Cu_4O_8$, whereas the sample in which y is 0.25 contains a second phase.

The samples were tested for superconductivity by measuring their resistance. The results are shown in Table 5 and FIG. 10.

TABLE 5

| z | X-ray diffractometry | $T_c^{on}$ (K) | $T_c^{R=0}$ (K) | $\rho^{300K}$ ($\times 10^{-3}$ Ω · cm) | Porosity (%) | Remarks |
| --- | --- | --- | --- | --- | --- | --- |
| 0.0 | Superconducting single phase | 81 | 77 | 6.2 | 37 | Comparative Example |
| 0.01 | Superconducting single phase | 82 | 78 | 2.3 | 10 | Example |
| 0.05 | Superconducting single phase | 82 | 78 | 0.74 | 8 | Example |
| 0.1 | Superconducting single phase | 83 | 80 | 0.42 | 5 | Example |
| 0.15 | Superconducting single phase | 81 | 78 | 0.52 | 6 | Example |
| 0.2 | Superconducting single phase | 80 | 77 | 0.88 | 7 | Example |
| 0.25 | Superconducting | 80 | 72 | 8.3 | 6 | Comparative |

TABLE 5-continued

| Z | X-ray diffractometry | $T_c^{on}$ (K) | $T_c^{R=0}$ (K) | $\rho^{300K}$ (×10$^{-3}$ Ω·cm) | Porosity (%) | Remarks |
|---|---|---|---|---|---|---|
| | phase plus impurity phase | | | | | Example |

Figure 10:
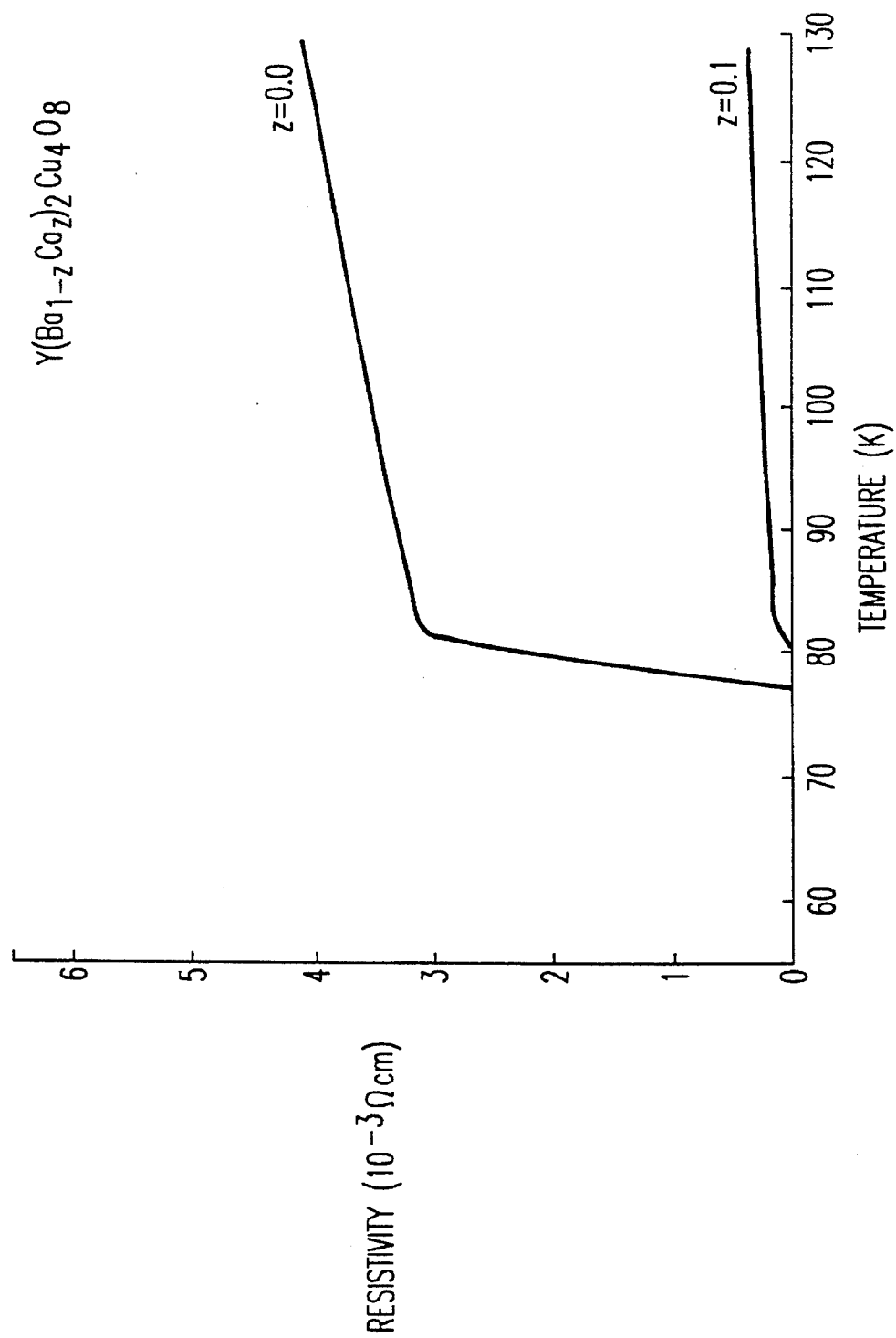
FIG. 10 is a graph showing the resistance-temperature characteristics of sample in Example 5 which is represented by $Y(Ba_{1-z}Ca_z)_2Cu_4O_8$.

It is noted from Table 5 and FIG. 10 that all the oxide superconductors Y(Ba$_{1-z}$Ca$_z$)$_2$Cu$_4$O$_8$ pertaining to the present invention have the $T_c$ of 80 K. level, which is higher than the boiling point (77K) of liquid nitrogen. It is also noted that the samples decrease in resistance (at room temperature) in proportion to the Ca content (z). Those samples having a low resistance at room temperature are expected to have a high critical current density. The sample in which z is 0.15 has the lowest resistance at room temperature. The resistance increases in proportion to the value of z when z is greater than 0.15, and when z is 0.25, the resistance is higher than that when z is 0.

The samples were tested for porosity by observing polished samples under an optical microscope. The results are shown in Table 5. It is noted that the porosity decreases in proportion to the value of z, reaching the minimum of about 5% when z is 0.15, and the porosity remains unchanged even when the value of z increases further.

The results of X-ray diffractometry and the measurements of porosity as mentioned above suggest that the decrease of resistance (at room temperature) in proportion to the value of z is due to the formation of a solid solution by partial substitution of Ca for Ba in YBa$_2$Cu$_4$O$_8$. Consequently, according to the present invention, the value of z should be in the range of 0.001 to 0.2.

Figure 11:
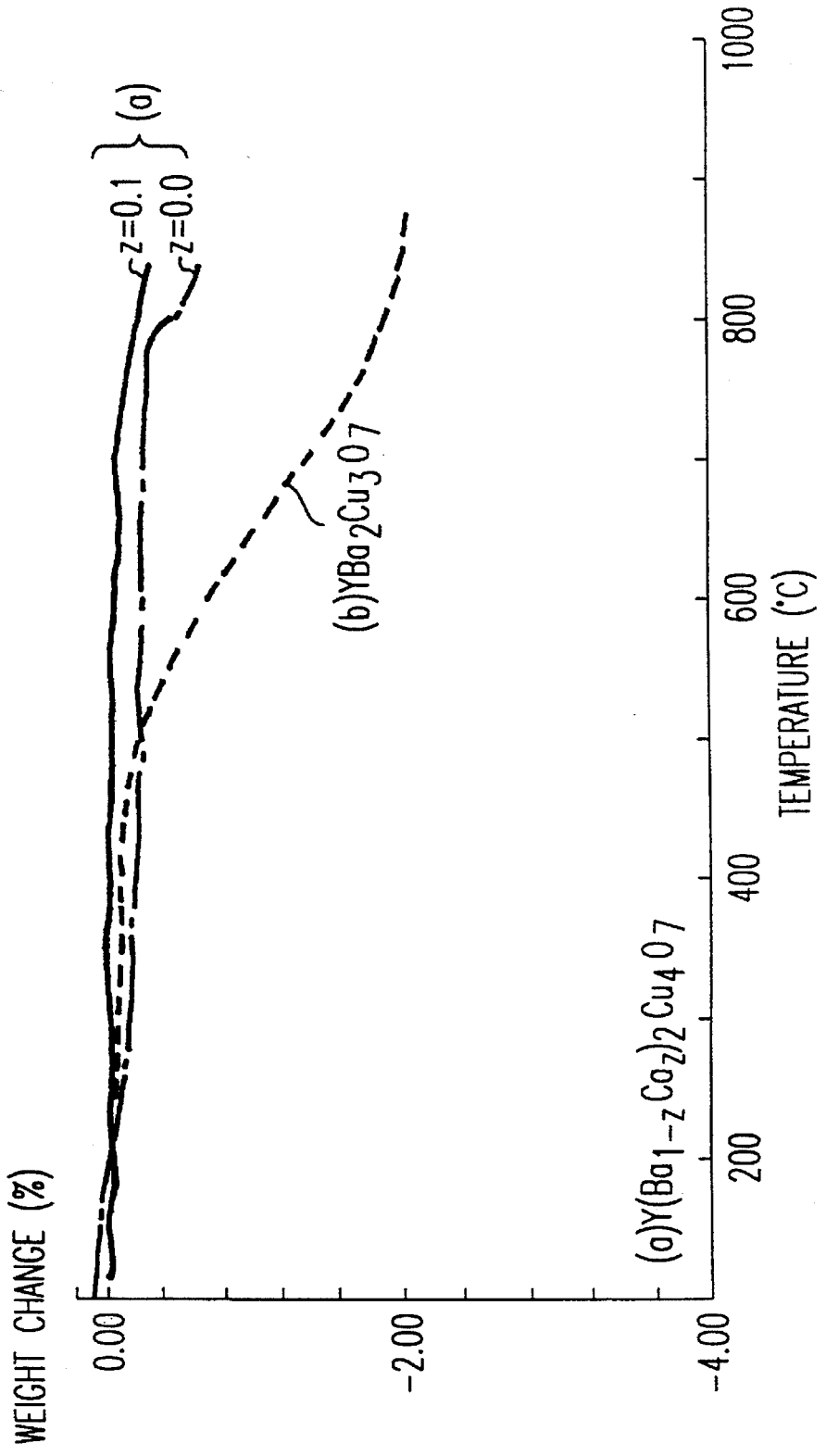
FIG. 11 is a graph showing the results of thermogravimetry for a sample in Example 5 which is represented by $Y(Ba_{1-z}Ca_z)_2Cu_4O_8$ (where z=0.1).

Thermogravimetry performed on the sample in which the value of z is 0.1 gave the results as shown in FIG. 11(a). It is noted that the samples remain unchanged in weight over the range from normal temperature to 850° C. and decrease in weight over the range from 850° C. to 900° C. These results suggest that the samples remain stable up to a temperature as high as 850° C. without absorption and liberation of oxygen. By contrast, the conventional superconductor YBa$_2$Cu$_3$O$_7$ loses a large amount of oxygen at 400° C. to 800° C., as shown in FIG. 5(b).

It will be understood from the foregoing that the superconductor YBa$_2$Cu$_4$O$_8$ as the base material is difficult to sinter and gives a sintered body having a porosity higher than 30%, whereas the samples in this example which are specified by the composition of Y(Ba$_{1-z}$Ca$_z$)$_2$Cu$_4$O$_8$ (where 0.001≦z≦0.2) have the $T_c$ higher than 80 K and give sintered bodies having a porosity lower than 10%. In addition, these samples have a low electric resistance at room temperature and remain stable up to 850° C. without absorption and liberation of oxygen.

EXAMPLE 6

Mixtures each having a chemical composition of Ho(Ba$_{1-z}$Ca$_z$)$_2$Cu$_4$O$_8$ (where z=0.01, 0.05, 0.1, 0.15, 0.2, or 0.25) were prepared from Ho$_2$O$_3$, Ba(NO$_3$)$_2$, CuO, and CaCO$_3$ (in powder form having a purity of 99.9%). The mixture was calcined at 850° C. for 24 hours in oxygen. The calcined product was crushed and molded into a rectangular prism. The molded material underwent preliminary sintering at 800° C. for 5 hours in oxygen. The sintered material underwent heat treatment in an atmosphere composed of 80% of argon and 20% of oxygen under a pressure of 1000 atm. The heat treatment consisted of heating up to 900° C. at a rate of 200° C./hr and keeping this temperature for 6 hours, and further heating up to 1020° C. at a rate of 200° C./hr and keeping this temperature for another 6 hours. The heat treatment was followed by cooling down to 300° C. at a rate of 200° C./hr. The atmosphere was depressurized to 1 atm and the heat-treated material was discharged. The heat-treated material was crushed again and molded. The molded material was sintered at 800° C. for 20 hours in oxygen.

Figure 12:
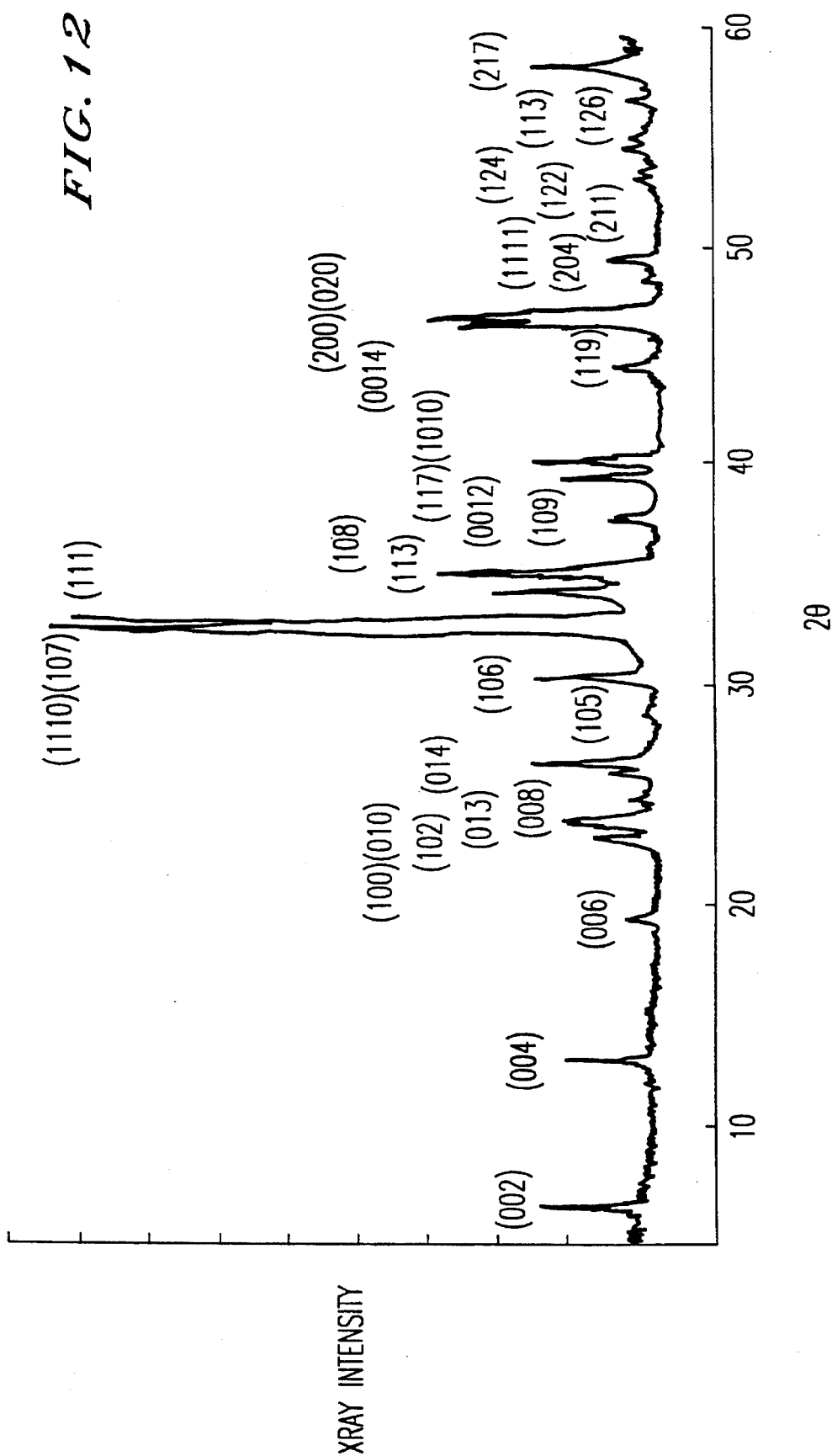
FIG. 12 is an X-ray diffraction pattern (powder method) of a sample in Example 6 which is represented by $Ho(Ba_{1-z}Ca_z)_2Cu_4O_8$ (where z=0.1).

The thus obtained sintered body (sample) was tested for phase by X-ray diffractometry (powder method). It was found that the principal constituent of the sample has the crystal structure of RBa$_2$Cu$_4$O$_8$ type. The sample in which z=0.1 gave an X-ray diffraction pattern (by powder method) as shown in FIG. 12. This pattern has the peaks attributable to the RBa$_2$Cu$_4$O$_8$ structure, which are indicated by indices. This sample is composed of a single superconducting phase.

The samples obtained in this example have the phases as shown in Table 6. The samples in which z is 0 to 0.2 are composed of a single phase of Ho(Ba$_{1-z}$Ca$_z$)$_2$Cu$_4$O$_8$, whereas the sample in which z is 0.25 contains a second phase.

The samples were tested for superconductivity by measuring their resistance. The results are shown in Table 6 and FIG. 13.

TABLE 6

| Z | X-ray diffractometry | $T_c^{on}$ (K) | $T_c^{R=0}$ (K) | $\rho^{300K}$ (×10$^{-3}$ Ω·cm) | Porosity (%) | Remarks |
|---|---|---|---|---|---|---|
| 0.0 | Superconducting single phase | 80 | 75 | 7.8 | 33 | Comparative Example |
| 0.01 | Superconducting single phase | 81 | 77 | 1.8 | 10 | Example |
| 0.05 | Superconducting single phase | 82 | 78 | 0.72 | 7 | Example |
| 0.1 | Superconducting single phase | 83 | 78 | 0.53 | 5 | Example |
| 0.15 | Superconducting single phase | 83 | 80 | 0.55 | 5 | Example |
| 0.20 | Superconducting | 82 | 78 | 0.81 | 6 | Example |

TABLE 6-continued

| z | X-ray diffractometry | $T_c^{on}$ (K) | $T_c^{R=0}$ (K) | $\rho^{300K}$ (×10$^{-3}$ Ω·cm) | Porosity (%) | Remarks |
|---|---|---|---|---|---|---|
| 0.25 | single phase Superconducting phase plus impurity phase | 82 | 68 | 9.4 | 6 | Comparative Example |

Figure 13:
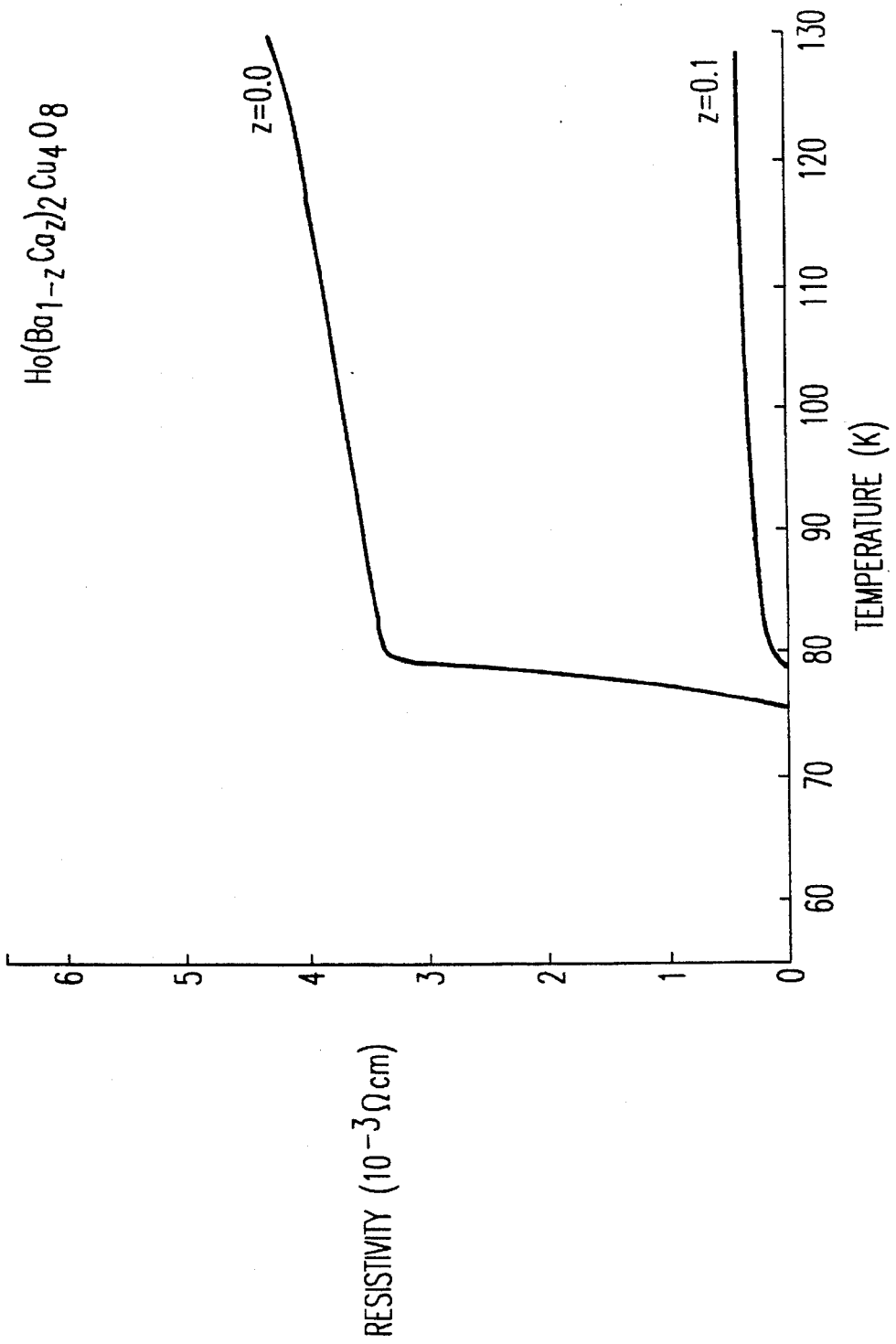
FIG. 13 is a graph showing the resistance-temperature characteristics of a sample in Example 6 which is represented by $Ho(Ba_{1-z}Ca_z)_2Cu_4O_8$.

It is noted from Table 6 and FIG. 13 that all the oxide superconductors Ho(Ba$_{1-z}$Ca$_z$)$_2$Cu$_4$O$_8$ pertaining to the present invention have the $T_c$ of 80 K level, which is higher than the boiling point (77 K) of liquid nitrogen. It is also noted that the samples decrease in resistance (at room temperature) in proportion to the Ca content (z). Those samples having a low resistance at room temperature are expected to have a high critical current density. The sample in which z is 0.15 has the lowest resistance at room temperature. The resistance increases in proportion to the value of z when z is greater than 0.15, and when z is 0.25, the resistance is higher than that when z is 0.

The samples were tested for porosity by observing polished samples under an optical microscope. The results are shown in Table 6. It is noted that the porosity decreases in proportion to the value of z, reaching the minimum of about 5% when z is 0.1, and the porosity remains unchanged even when the value of z increases further.

The results of X-ray diffractometry and the measurements of porosity as mentioned above suggest that the decrease of resistance (at room temperature) in proportion to the value of z is due to the formation of a solid solution by partial substitution of Ca for Ba in HoBa$_2$Cu$_4$O$_8$.

Figure 14:
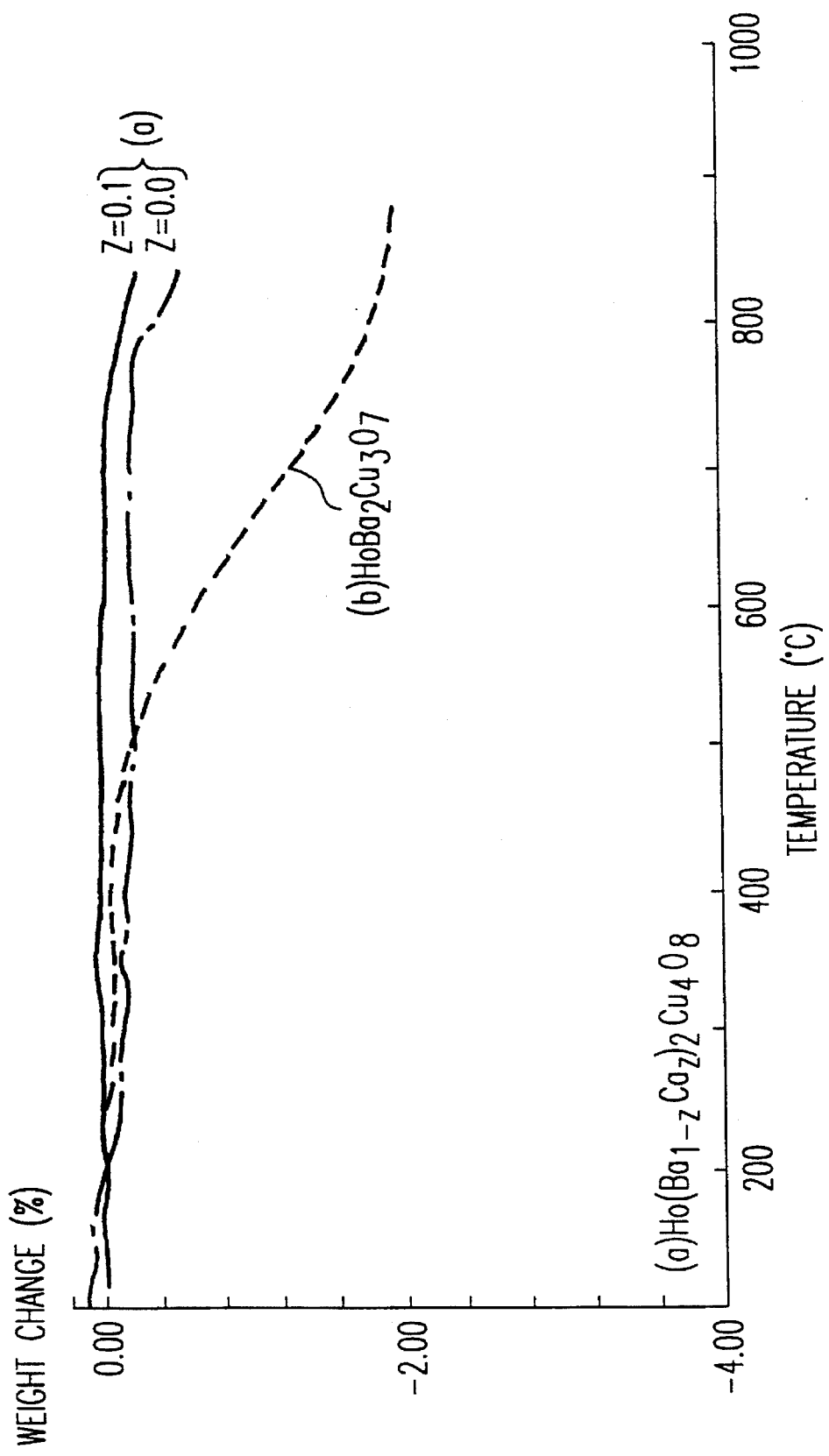
FIG. 14 is a graph showing the results of thermogravimetry for a sample in Example 6 which is represented by $Ho(Ba_{1-z}Ca_z)_2Cu_4O_8$ (where z=0.1).

Thermogravimetry performed on the sample in which the value of z is 0.1 gave the results as shown in FIG. 14(a). It is noted that the sample remains unchanged in weight over the range from normal temperature to 850° C. and decrease in weight over the range from 850° C. to 900° C. These results suggest that the sample remains stable up to a temperature as high as 850° C. without absorption and liberation of oxygen. By contrast, the conventional superconductor HoBa$_2$Cu$_3$O$_7$ loses a large amount of oxygen at 400° C. to 800° C., as shown in FIG. 14(b).

It will be understood from the foregoing that the superconductor HoBa$_2$Cu$_4$O$_8$ as the base material has the $T_c$ of 80 K. and is difficult to sinter and gives a sintered body having a porosity higher than 30%, whereas the samples in this example which are specified by the composition of Ho(Ba$_{1-z}$Ca$_z$)$_2$Cu$_4$O$_8$ (where 0.001 ≦ z ≦ 0.2) have the $T_c$ higher than 80 K. and give sintered bodies having a porosity lower than 20%. In addition, these samples have a low electric resistance at room temperature and remain stable up to 850° C. without absorption and liberation of oxygen.

Example 7

Samples were prepared in the same manner as in Example 5 except that Ho in Ho(Ba$_{1-z}$Ca$_z$)$_2$Cu$_4$O$_8$ was replaced by Nd, Sm, Eu, Gd, Dy, Er, Tm, Yb, or Lu, with the value of z fixed at 0.1. The samples were evaluated in the same manner as in Example 5. The results are shown in Table 7.

It is noted from Table 7 that the same effect is produced even when R is changed from Ho to any of Nd, Sm, Eu, Gd, Dy, Er, Tm, Yb, or Lu.

TABLE 7

| R | X-ray diffractometry | $T_c^{on}$ (K) | $T_c^{R=0}$ (K) | $\rho^{300K}$ (×10$^{-3}$ Ω·cm) | Porosity (%) | Remarks |
|---|---|---|---|---|---|---|
| Nd | Superconducting single phase | 84 | 80 | 0.66 | 9 | Example |
| Sm | Superconducting single phase | 83 | 78 | 0.59 | 8 | Example |
| Eu | Superconducting single phase | 83 | 78 | 0.55 | 8 | Example |
| Gd | Superconducting single phase | 82 | 77 | 0.54 | 6 | Example |
| Dy | Superconducting single phase | 83 | 79 | 0.60 | 7 | Example |
| Er | Superconducting single phase | 82 | 78 | 0.52 | 8 | Example |
| Tm | Superconducting single phase | 82 | 77 | 0.56 | 5 | Example |
| Yb | Superconducting phase plus impurity phase | 81 | 77 | 0.72 | 7 | Example |
| Lu | Superconducting phase plus impurity phase | 81 | 76 | 0.96 | 8 | Example |

Example 8

Samples were prepared in the same manner as in Example 5 except that R in R(Ba$_{1-z}$Ca$_z$)$_2$Cu$_4$O$_8$ was replaced by Y and Ho in varied amounts, with the value of z fixed at 0.1. (In other words, the samples are represented by (Y$_{1-p}$Ho$_p$)(Ba$_{0.9}$Ca$_{0.1}$)$_2$Cu$_4$O$_8$, with the value of p varied.) The samples were evaluated in the same manner as in Example 5. The results are shown in Table 8.

It is noted from Table 8 that the same effect is produced even when R is replaced by Y and Ho in varied amounts. It is expected that the same effect will be produced even when R is replaced by Y and two or more elements selected from lanthanide rare earth elements.

TABLE 8

| P | X-ray diffractometry | $T_c^{on}$ (K) | $T_c^{R=0}$ (K) | $\rho^{300K}$ ($\times 10^{-3}$ Ω·cm) | Porosity (%) | Remarks |
|---|---|---|---|---|---|---|
| 0.2 | Superconducting single phase | 83 | 80 | 0.48 | 5 | Example |
| 0.4 | Superconducting single phase | 84 | 79 | 0.50 | 4 | Example |
| 0.6 | Superconducting single phase | 83 | 79 | 0.50 | 4 | Example |
| 0.8 | Superconducting single phase | 83 | 78 | 0.53 | 4 | Example |

Example 9

Mixtures each having a chemical composition of $(R_{1-x}Ca_x)(Ba_{1-y}Sr_y)_2Cu_4O_8$ (where x=0, 0.001, 0.01, 0.1, 0.3, or 0.5, and y=0, 0.001, 0.01, 0.1, 0.3, 0.5, 0.6, or 0.7) were prepared in an inert atmosphere from $R_2O_3$, $Ba(NO_3)_2$, CuO, and $Sr(NO_3)_2$ (in powder form having a purity higher than 99.9%). The mixture was calcined at 750° C. for 10 hours and then at an arbitrary temperature from 750° C. to 900° C. for 10 hours in an oxygen stream. The calcined product was crushed and molded into a rectangular prism. The molded material underwent preliminary sintering at 800° C. for 5 hours in an oxygen stream. The sintered material underwent heat treatment in an atmosphere composed of 80% of argon and 20% of oxygen under a pressure of 1000 atm. The heat treatment consisted of heating up to 1000° C. at a rate of 200° C./hr and keeping this temperature for 10 hours. The heat treatment was followed by cooling down to 300° C. at a rate of 200° C./hr. The atmosphere was depressurized to 1 atm and the heat-treated material was discharged. The heat-treated material was crushed again and molded. The molded material was sintered at 800° C. for 20 hours in an oxygen stream.

Incidentally, R in $R_2O_3$ (mentioned above) represents any one or a combination of Y, Nd, Sm, Eu, Gd, Dy, Ho, Er, and Tm. Examples of the combination include Y:Er=1:1, Y:Eu= 1:1, and Y:Ho=1:1. The combinations of R's, the combination of x and y, and the starting materials are shown in Table 9(1).

Figure 15:
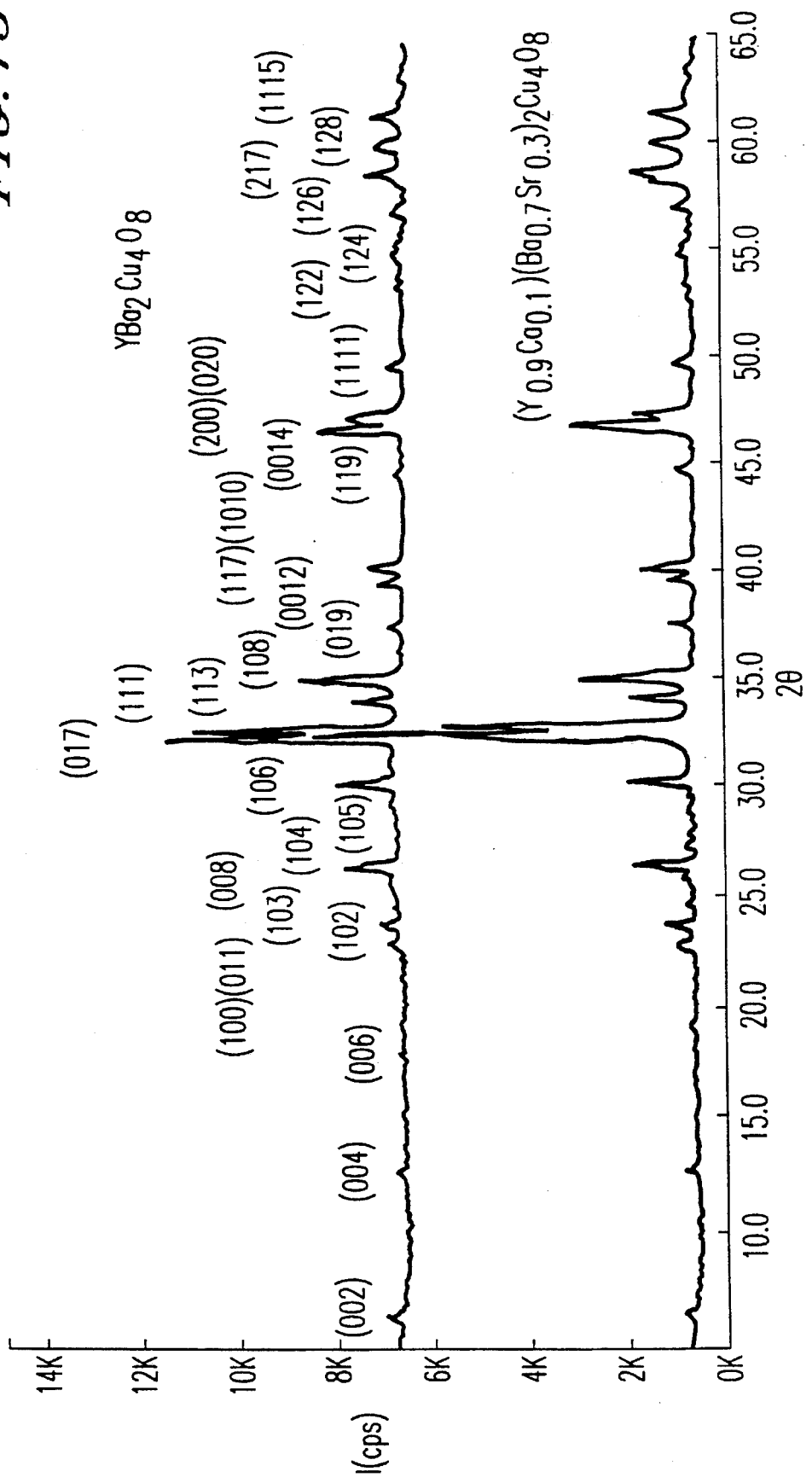
FIG. 15 is an X-ray diffraction pattern (powder method) of a sample in Example 9 which is represented by $(R_{1-x}Ca_x)(Ba_{1-y}Sr_y)_2Cu_4O_8$ (where x=0.1 and y=0.3).

The thus obtained sintered body (sample) was tested for phase by X-ray diffractometry (powder method). It was found that the principal constituent of the sample has the crystal structure of $YBa_2Cu_4O_8$ type. The sample in which x=0.1 and y=0.3 gave an X-ray diffraction pattern (by powder method) as shown in FIG. 15. This pattern has the peaks attributable to the $YBa_2Cu_4O_8$ structure, which are indicated by indices. This sample is composed of a single superconducting phase. The samples in which x is 0 to 0.15 and y is 0 to 0.5 are composed of a single superconducting phase. The samples obtained in this example have the phases as shown in Table 9(2).

The samples were tested for superconductivity by measuring their resistance. The results are shown in Table 9(2) and FIG. 16.

Figure 16:
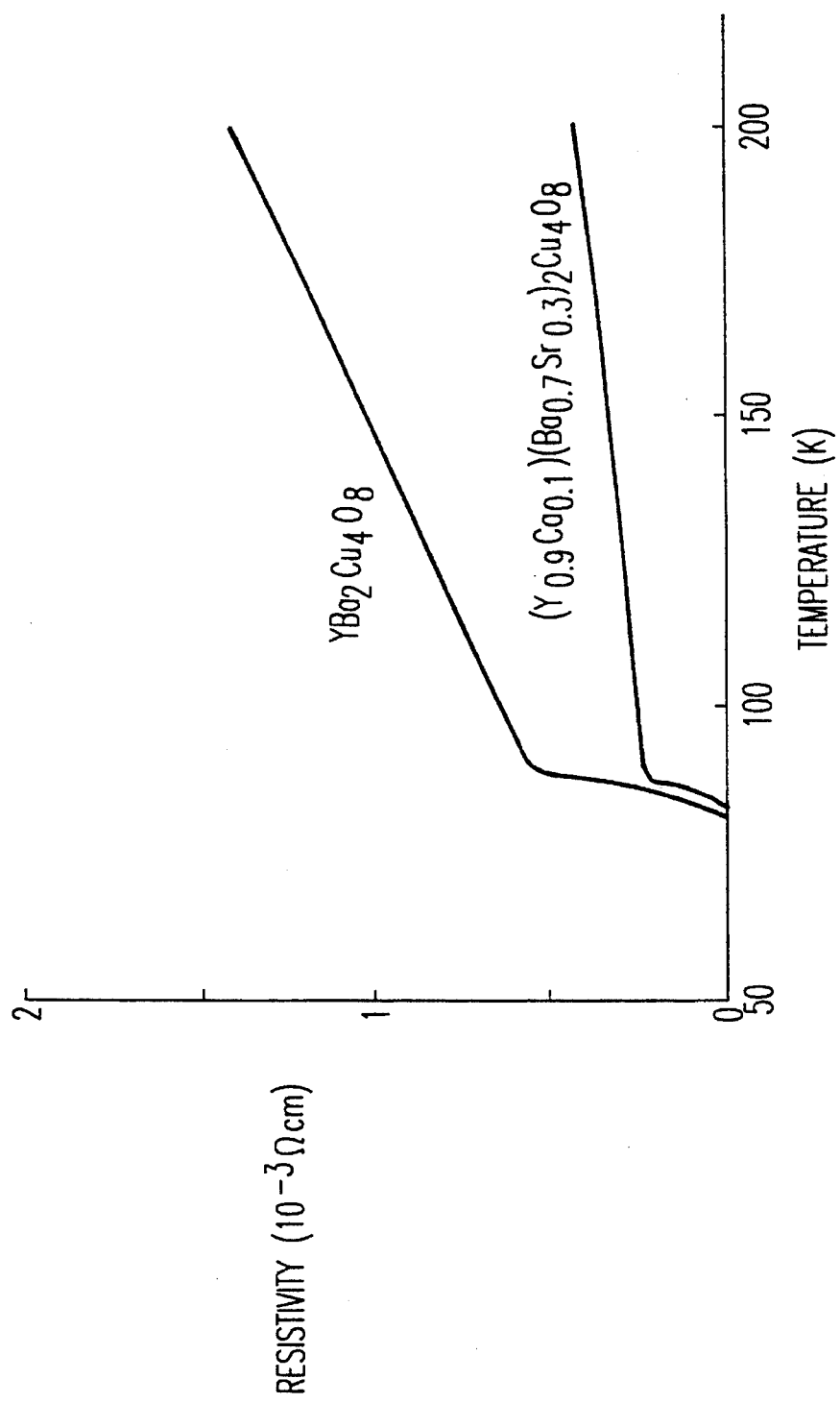
FIG. 16 is a graph showing the resistance-temperature characteristics of a sample in Example 9 which is represented by $(R_{1-x}Ca_x)(Ba_{1-y}Sr_y)_2Cu_4O_8$ (where x=0.1 and y=0.3).
Figure 17:
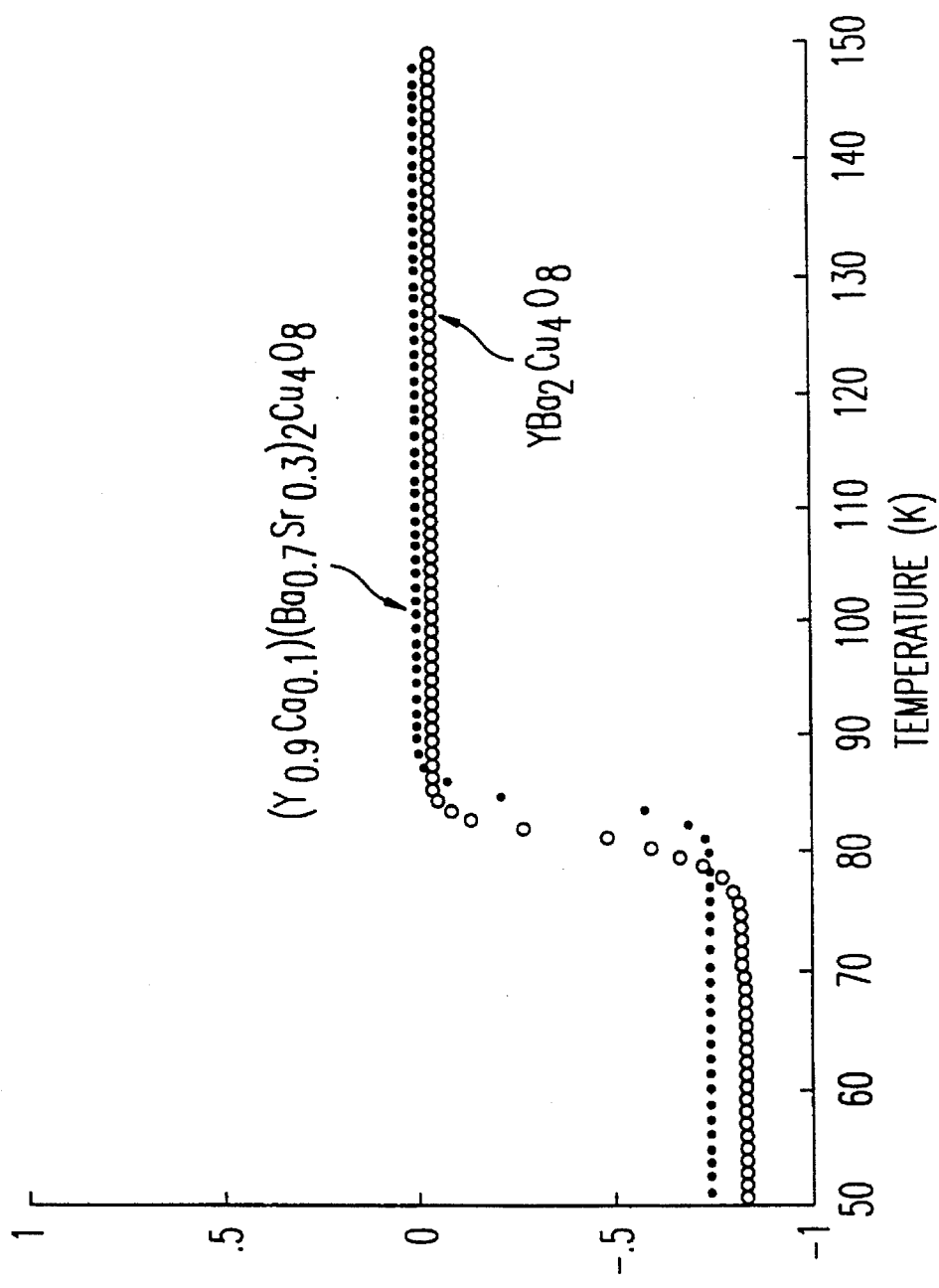
FIG. 17 is a graph showing the a.c. susceptibility of a sample in Example 9 which is represented by $(R_{1-x}Ca_x)(Ba_{1-y}Sr_y)_2Cu_4O_8$ (where x=0.1 and y=0.3).

It is noted from Table 9(2) and FIG. 16 that all the oxide superconductors $(R_{1-x}Ca_x)(Ba_{1-y}Sr_y)_2Cu_4O_8$ in this example have the $T_c$ of 80 K level if the value of x (Ca content) is from 0 to 0.3 and the value of y (Sr content) is from 0 to 0.6. They also exhibit diamagnetism at temperatures above 80 K as proved by the measurement of a.c. susceptibility. (See FIG. 17.) This suggests the emergence of superconductivity at temperatures above 80 K and supports the results of the measurement of resistance. The $T_c$ is higher than the boiling point (77 K) of liquid nitrogen.

The samples were analyzed for Ba content. The results are shown in Table 9(2). It is noted that as the Sr content increases the Ba content decreases. This is advantageous to production. When the value of y (or the Sr content) is 0.6, the Ba content is about 5 mol %. With an excessive Sr content, the sample has a low $T_c$. For example, the sample No. 26 in which y=0.7 has the $T_c$ as low as 40 K.

Figure 18:
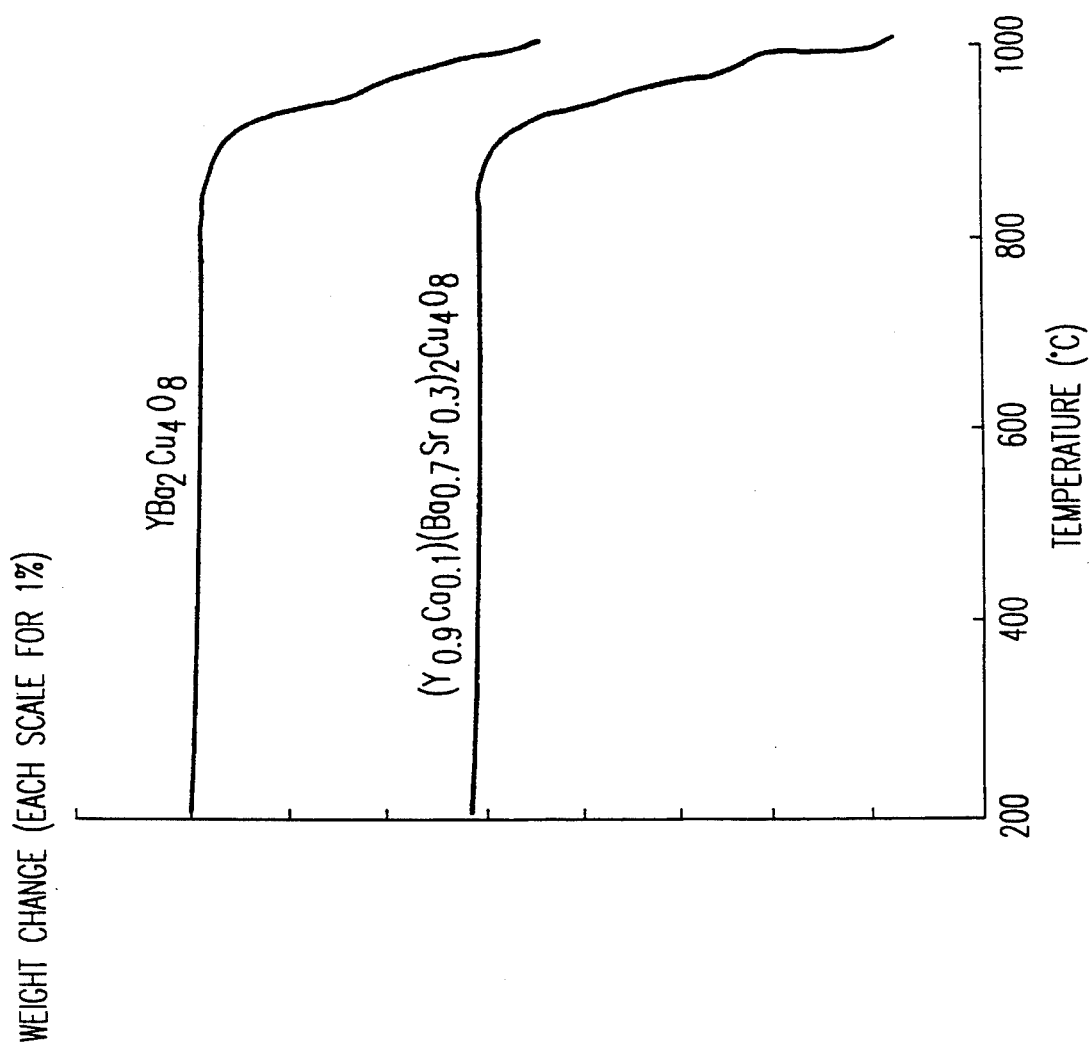
FIG. 18 is a graph showing the results of thermogravimetry of a sample in Example 9 which is represented by $(R_{1-x}Ca_x)(Ba_{1-y}Sr_y)_2Cu_4O_8$ (where x=0.1 and y=0.3).

Thermogravimetry performed on the sample in which x=0.1 and y=0.3 gave the results as shown in FIG. 18. It is noted that the sample remains unchanged in weight over the range from normal temperature to 850° C. and decreases in weight over the range from 850° C. to 900° C. These results suggest that the sample remains stable up to a temperature as high as 850° C. without absorption and liberation of oxygen, as in the case of the conventional oxide superconductor of $YBa_2Cu_4O_8$ type.

As explained above, the present invention provides oxide superconductors having the composition represented by $(R_{1-x}Ca_x)(Ba_{1-y}Sr_y)_2Cu_4O_8$ (where R denotes one of or any combination of Y, Nd, Sm, Eu, Gd, Dy, Ho, Er, and Tm; x is 0.001 to 0.3; and y is 0.001 to 0.6). All of them have the $T_c$ higher than 80 K. They remain stable up to about 850° C. without absorption and liberation of oxygen. They can be produced with as small a Ba content as 5.33 mol %. This is a great advantage over the conventional oxide superconductor of $YBa_2Cu_4O_8$ type which contains as much Ba as 13.33 mol % and hence needs special care in its production. According to the present invention, it is possible to produce an improved oxide superconductor which contains a less amount of Ba (40% of the Ba content in the conventional one) and yet has the $T_c$ higher than 80 K.

TABLE 9 (1)

| Sample No. | Chemical Composition $(R_{1-x}Ca_x)(Ba_{1-y}Sr_y)_2Cu_4O_8$ | | | Starting materials |
|---|---|---|---|---|
| | R | x | y | |
| 1 | Y | 0.001 | 0.001 | $Y_2O_3$, CaO, $Ba(NO_3)_2$, $Sr(NO_3)_2$, CuO |
| 2 | Y:Er = 1:1 | 0.001 | 0.05 | $Y_2O_3$, $Er_2O_3$, CaO, $Ba(NO_3)_2$, $Sr(NO_3)_2$, CuO |
| 3 | Er | 0.001 | 0.1 | $Er_2O_3$, CaO, $Ba(NO_3)_2$, $Sr(NO_3)_2$, CuO |
| 4 | Ho | 0.001 | 0.3 | $Ho_2O_3$, CaO, $Ba(NO_3)_2$, $Sr(NO_3)_2$, CuO |
| 5 | Y | 0.001 | 0.6 | $Y_2O_3$, CaO, $Ba(NO_3)_2$, $Sr(NO_3)_2$, CuO |
| 6 | Nd | 0.1 | 0.001 | $Nd_2O_3$, CaO, $Ba(NO_3)_2$, $Sr(NO_)_2$, CuO |
| 7 | Gd | 0.1 | 0.1 | $Gd_2O_3$, CaO, $Ba(NO_3)_2$, $Sr(NO_3)_2$. CuO |
| 8 | Y | 0.1 | 0.3 | $Y_2O_3$, CaO, $Ba(NO_3)_2$, $Sr(NO_3)_2$, CuO |
| 9 | Sm | 0,1 | 0.3 | $Sm_2O_3$, CaO, $Ba(NO_3)_2$, $Sr(NO_3)_2$, CuO |
| 10 | Y:Eu = 1:1 | 0.1 | 0.4 | $Y_2O_3$, $Eu_2O_3$, CaO, $Ba(NO_3)_2$, $Sr(NO_3)_2$, CuO |
| 11 | Dy | 0.1 | 0.6 | $Dy_2O_3$, CaO, $Ba(NO_3)_2$, $Sr(NO_3)_2$, CuO |
| 12 | Tm | 0.3 | 0.001 | $Tm_2O_3$, CaO, $Ba(NO_3)_2$, $Sr(NO_3)_2$, CuO |
| 13 | Er | 0.3 | 0.1 | $Er_2O_3$, CaO, $Ba(NO_3)_2$, $Sr(NO_3)_2$, CuO |
| 14 | Y | 0.3 | 0.3 | $Y_2O_3$, CaO, $Ba(NO_3)_2$, $Sr(NO_3)_2$, CuO |
| 15 | Y:Ho = 1:1 | 0.3 | 0.5 | $Y_2O_3$, $Ho_2O_3$, CaO, $Ba(NO_3)_2$, $Sr(NO_3)_2$, CuO |
| 16 | Eu | 0.3 | 0.6 | $Eu_2O_3$, CaO, $Ba(NO_3)_2$, $Sr(NO_3)_2$, CuO |
| 17 | Y | 0.0 | 0.0 | $Y_2O_3$, $Ba(NO_3)_2$, CuO |
| 18 | Nd | 0.0 | 0.0 | $Nd_2O_3$, $Ba(NO_3)_2$, CuO |
| 19 | Sm | 0.0 | 0.0 | $Sm_2O_3$, $Ba(NO_3)_2$, CuO |
| 20 | Eu | 0.0 | 0.0 | $Eu_2O_3$, $Ba(NO_3)_2$, CuO |
| 21 | Gd | 0.0 | 0.0 | $Gd_2O_3$, $Ba(NO_3)_2$, CuO |
| 22 | Dy | 0.0 | 0.0 | $Dy_2O_3$, $Ba(NO_3)_2$, CuO |
| 23 | Ho | 0.0 | 0.0 | $Ho_2O_3$, $Ba(NO_3)_2$, CuO |
| 24 | Er | 0.0 | 0.0 | $Er_2O_3$, $Ba(NO_3)_2$, CuO |
| 25 | Tm | 0.0 | 0.0 | $Tm_2O_3$, $Ba(NO_3)_2$, CuO |
| 26 | Y | 0.001 | 0.7 | $Y_2O_3$, CaO, $Ba(NO_3)_2$, $Sr(NO_3)_2$, CuO |
| 27 | Eu | 0.1 | 0.7 | $Eu_2O_3$CaO, $Ba(NO_3)_2$, $Sr(NO_3)_2$, CuO |
| 28 | Y | 0.4 | 0.01 | $Y_2O_3$, CaO, $Ba(NO_3)_2$, $Sr(NO_3)_2$, CuO |
| 29 | Sm | 0.4 | 0.7 | $Sm_2O_3$, CaO, $Ba(NO_3)_2$, $Sr(NO_3)_2$, CuO |
| 30 | Gd | 0.3 | 0.7 | $Gd_2O_3$, CaO, $Ba(NO_3)_2$, $Sr(NO_3)_2$, CuO |

TABLE 9 (2)

| Sample No. | Ba Content (mol %) | Calcination temp. (°C.) | Sintering temp. (°C.) | Phase | $T_c$ (K) | Remarks |
|---|---|---|---|---|---|---|
| 1 | 13.32 | 900 | 950 | $YBa_2Cu_4O_8$ | 83 | Example |
| 2 | 12.67 | 920 | 940 | $YBa_2Cu_4O_8$ | 83 | Example |
| 3 | 12.00 | 900 | 950 | $YBa_2Cu_4O_8$ | 83 | Example |
| 4 | 9.33 | 920 | 950 | $YBa_2Cu_4O_8$ | 83 | Example |
| 5 | 5.33 | 910 | 950 | $YBa_2Cu_4O_8$, $Y_2O_3$ | 82 | Example |
| 6 | 13.32 | 910 | 940 | $YBa_2Cu_4O_8$ | 85 | Example |
| 7 | 12.00 | 910 | 940 | $YBa_2Cu_4O_8$ | 85 | Example |
| 8 | 9.33 | 920 | 950 | $YBa_2Cu_4O_8$ | 85 | Example |
| 9 | 9.33 | 910 | 950 | $YBa_2Cu_4O_8$ | 85 | Example |
| 10 | 8.00 | 920 | 950 | $YBa_2Cu_4O_8$, $Y_2Cu_2O_5$ | 84 | Example |
| 11 | 5.33 | 900 | 950 | $YBa_2Cu_4O_8$, $Y_2Cu_2O_5$ | 84 | Example |
| 12 | 13.32 | 900 | 950 | $YBa_2Cu_4O_8$, $BaCuO_2$ | 85 | Example |
| 13 | 12.00 | 900 | 950 | $YBa_2Cu_4O_8$, $BaCuO_2$ | 85 | Example |
| 14 | 9.33 | 920 | 950 | $YBa_2Cu_4O_8$, $BaCuO_2$ | 85 | Example |
| 15 | 6.67 | 900 | 940 | $YBa_2Cu_4O_8$, $BaCuO_2$ | 84 | Example |
| 16 | 5.33 | 920 | 950 | $YBa_2Cu_4O_8$, $BaCuO_2$, $Y_2Cu_2O_5$ | 85 | Example |
| 17 | 13.33 | 800 | 900 | $YBa_2Cu_4O_8$ | 82 | Compar. Example |
| 18 | 13.33 | 750 | 920 | $YBa_2Cu_4O_8$ | 80 | Compar. Example |
| 19 | 13.33 | 800 | 900 | $YBa_2Cu_4O_8$ | 82 | Compar. Example |
| 20 | 13.33 | 800 | 900 | $YBa_2Cu_4O_8$ | 82 | Compar. Example |
| 21 | 13.33 | 800 | 900 | $YBa_2Cu_4O_8$ | 82 | Compar. Example |
| 22 | 13.33 | 800 | 900 | $YBa_2Cu_4O_8$ | 83 | Compar. Example |
| 23 | 13.33 | 800 | 900 | $YBa_2Cu_4O_8$ | 83 | Compar. Example |
| 24 | 13.33 | 800 | 900 | $YBa_2Cu_4O_8$ | 81 | Compar. Example |
| 25 | 13.33 | 800 | 900 | $YBa_2Cu_4O_8$ | 81 | Compar. Example |
| 26 | 4.00 | 700 | 850 | $YBa_2Cu_4O_8$ | 40 | Compar. |

TABLE 9 (2)-continued

| Sample No. | Ba Content (mol %) | Calcination temp. (°C.) | Sintering temp. (°C.) | Phase | $T_c$ (K) | Remarks |
| --- | --- | --- | --- | --- | --- | --- |
| 27 | 4.00 | 700 | 800 | $YBa_2Cu_4O_8$, $BaCuO_2$ | — | Example Compar. Example |
| 28 | 13.20 | 750 | 800 | $YBa_2Cu_4O_8$, $BaCuO_2$ | — | Example Compar. Example |
| 29 | 4.00 | 700 | 850 | $YBa_2Cu_4O_8$, $BaCuO_2$, $Sm_2O_3$ | — | Example Compar. Example |
| 30 | 4.00 | 720 | 850 | $YBa_2Cu_4O_8$, $BaCuO_2$, $Gd_2O_3$ | — | Example Compar. Example |

Example 10

Mixtures each having a chemical composition of $(R_{1-x}Ca_x)(Ba_{1-y}Sr_y)_2Cu_4O_8$ (where x=0, 0.001, 0.01, 0.1, 0.3, or 0.5, and y=0, 0.001, 0.01, 0.1, 0.3, 0.5, 0.6, or 0.7) were prepared in an inert atmosphere from $R_2O_3$ (where R denotes Y, Nd, Sm, Eu, Gd, Dy, Ho, Er, or Tm), $CaCO_3$, $BaCO_3$, $SrCO_3$, and CuO (in powder form having a purity higher than 99.9%). The mixture was calcined at an arbitrary temperature from 900° C. to 950° C. for 10 hours in an oxygen stream. The calcined product was crushed and molded into a rectangular prism. The molded material underwent preliminary sintering at 950° C. for 5 hours in an oxygen stream. The sintered material underwent heat treatment in an atmosphere composed of 80% of argon and 20% of oxygen under a pressure of 1000 atm. The heat treatment consisted of heating up to 1000° C. at a rate of 200° C./hr and keeping this temperature for 10 hours. The heat treatment was followed by cooling down to 300° C. at a rate of 200° C./hr. The atmosphere was depressurized to 1 atm and the heat-treated material was discharged. The heat-treated material was crushed again and molded. The molded material was sintered at 800° C. for 20 hours in an oxygen stream.

The combinations of R's, the combinations of x and y, and the starting materials are shown in Table 10(1).

Figure 19:
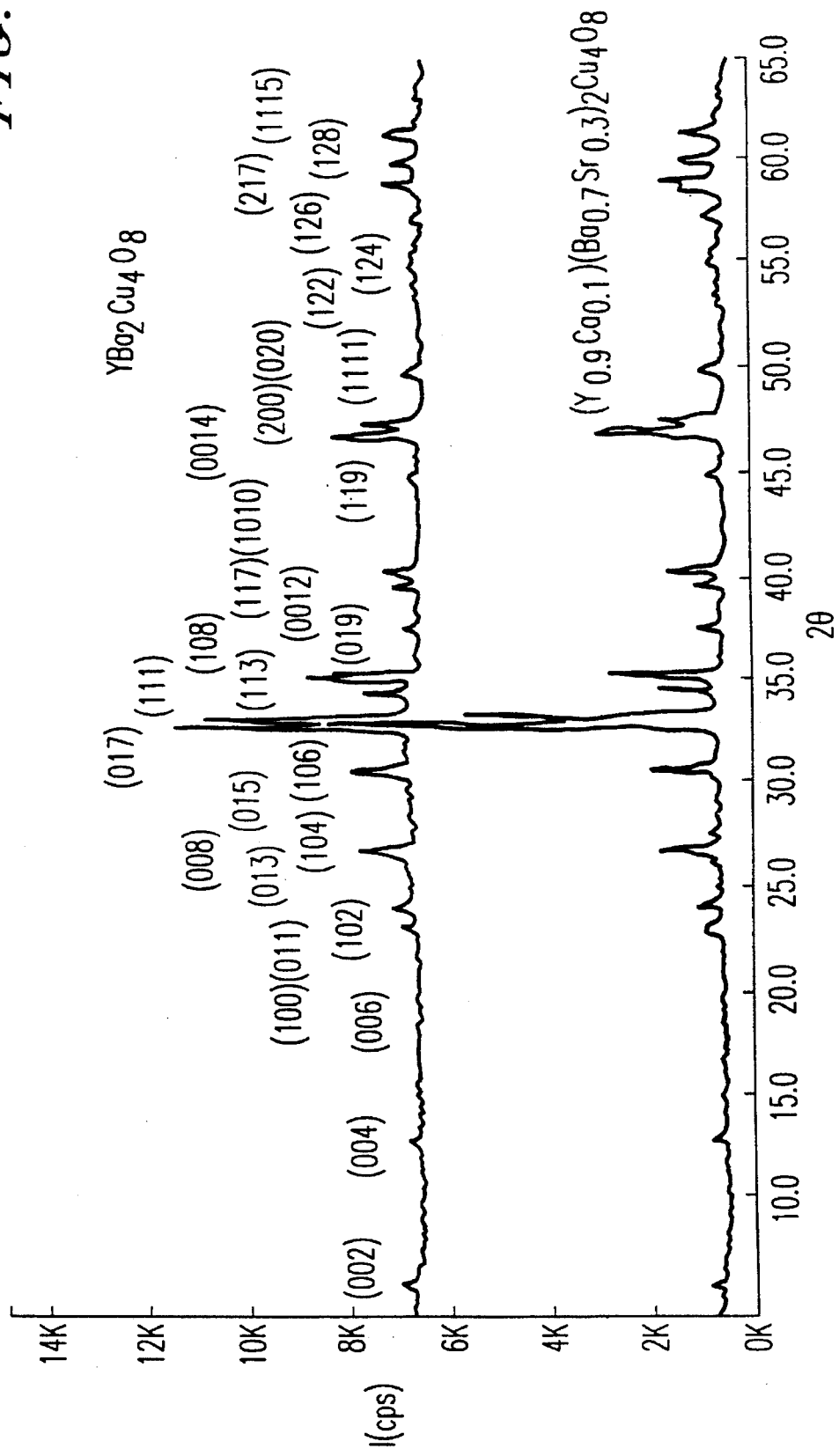
FIG. 19 is an X-ray diffraction pattern (powder method) of a sample in Example 10 which is represented by $(R_{1-x}Ca_x)(Ba_{1-y}Sr_y)_2Cu_4O_8$ (where x=0.1 and y=0.3).

The thus obtained sintered body (sample) was tested for phase by X-ray diffractometry (powder method). It was found that the principal constituent of the sample has the crystal structure of $YBa_2Cu_4O_8$ type. The sample in which x=0.1 and Y=0.3 gave an X-ray diffraction pattern (by powder method) as shown in FIG. 19. This pattern has the peaks attributable to the $YBa_2Cu_4O_8$ structure, which are indicated by indices. This sample is composed of a single superconducting phase. The samples in which x is 0 to 0.15 and y is 0 to 0.5 are composed of a single superconducting phase. The samples obtained in this example have the phases as shown in Table 10(2).

The samples were tested for superconductivity by measuring their resistance. The results are shown in Table 10(2) and FIG. 20.

Figure 20:
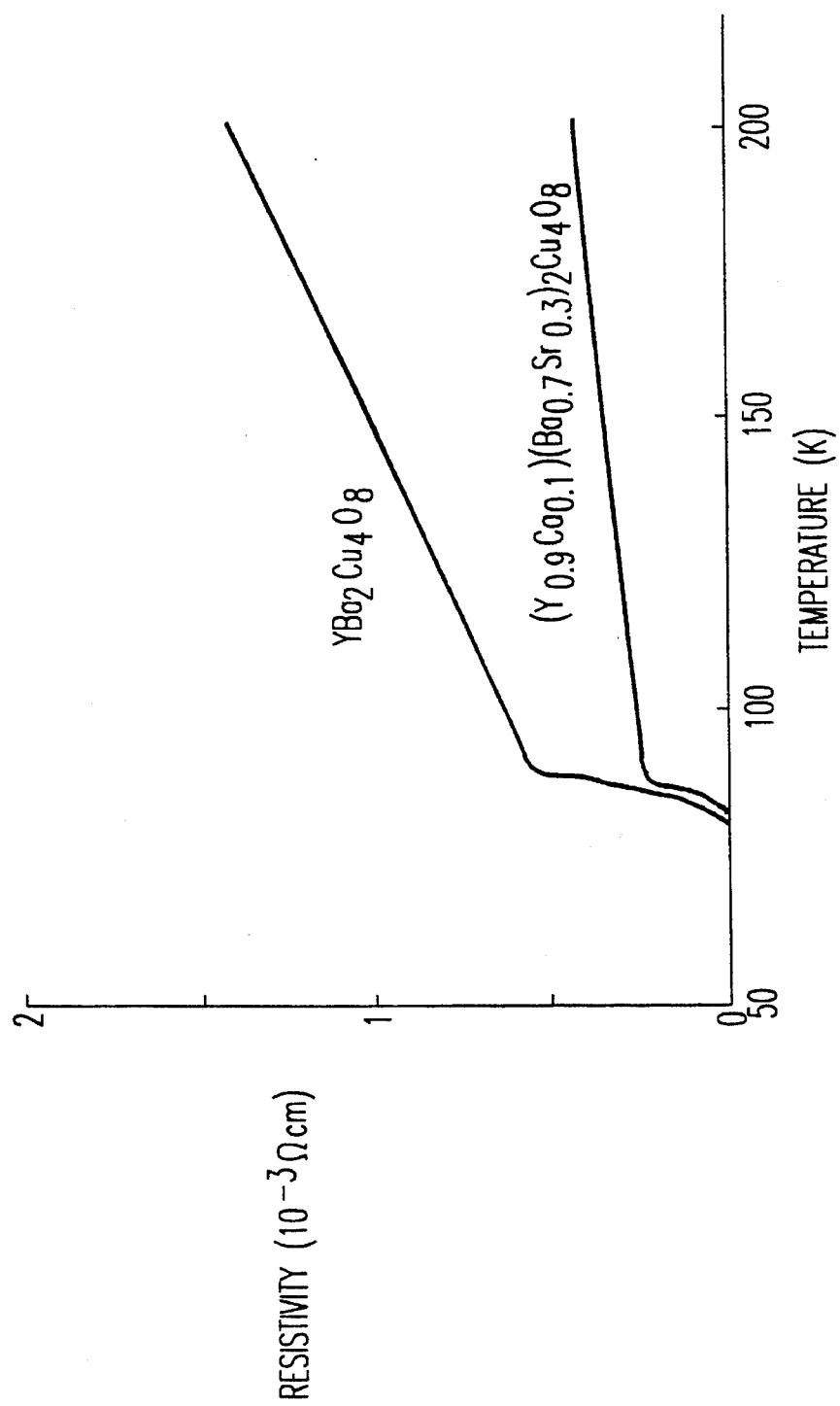
FIG. 20 is a graph showing the resistance-temperature characteristics of a sample in Example 10 which is represented by $(R_{1-x}Ca_x)(Ba_{1-y}Sr_y)_2Cu_4O_8$ (where x=0.1 and y=0.3).
Figure 21:
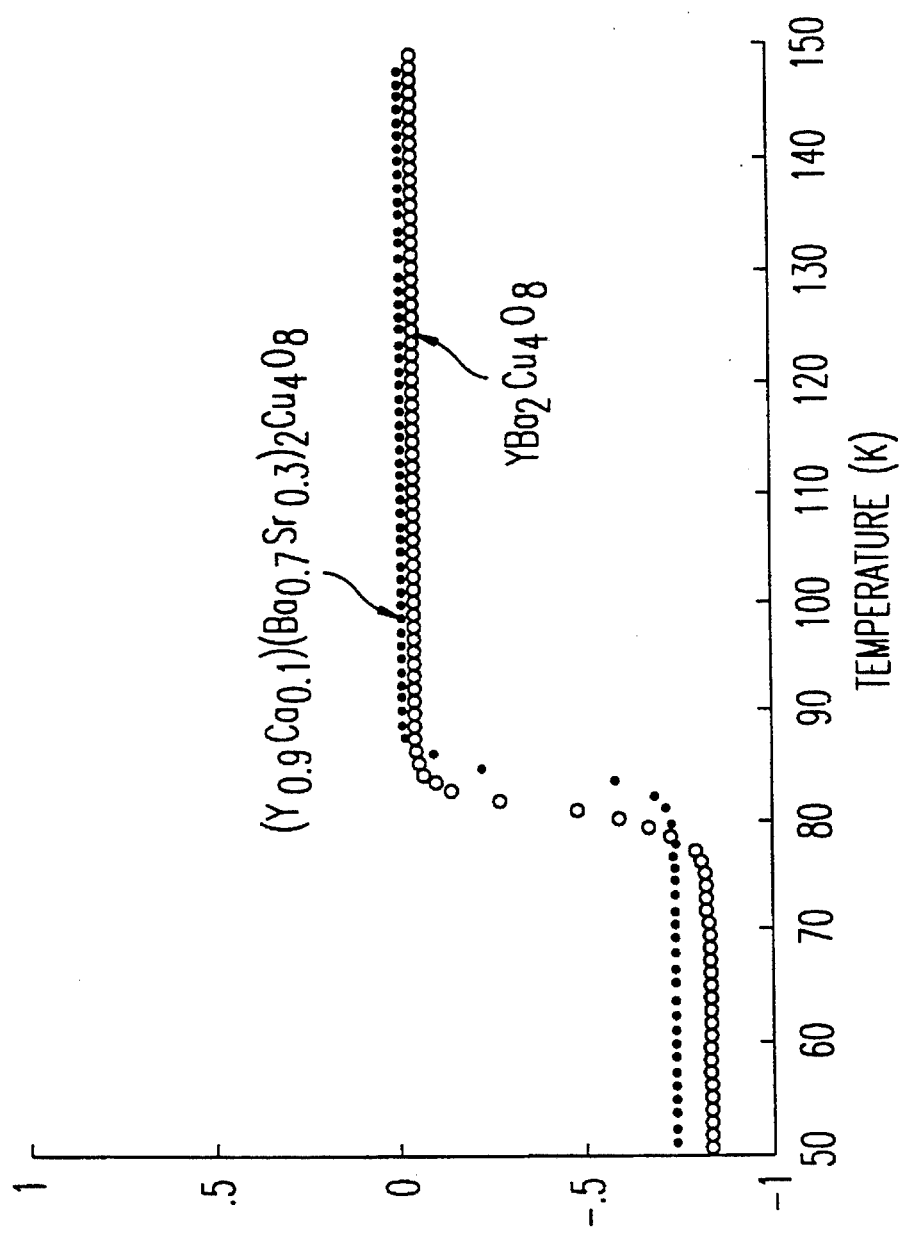
FIG. 21 is a graph showing the a.c. susceptibility of a sample in Example 10 which is represented by $(R_{1-x}Ca_x)(Ba_{1-y}Sr_y)_2Cu_4O_8$ (where x=0.1 and y=0.3).

It is noted from Table 10(2) and FIG. 20 that all the oxide superconductors $(R_{1-x}Ca_x)(Ba_{1-y}Sr_y)_2Cu_4O_8$ in this example have the $T_c$ of 80 K. level if the value of x (Ca content) is from 0 to 0.3 and the value of y (Sr content) is from 0 to 0.6. They also exhibit diamagnetism at temperatures above 80 K. as proved by the measurement of a.c. susceptibility. (See FIG. 21.) This suggests the emergence of superconductivity at temperatures above 80 K. and supports the results of the measurement of resistance. The $T_c$ is higher than the boiling point (77 K.) of liquid nitrogen.

The samples were analyzed for Ba content. The results are shown in Table 10(2). It is noted that the Ba content decreases as the Sr content increases. This is advantageous to production. When the value of y (or the Sr content) is 0.6, the Ba content is about 5 mol %. With an excessive Sr content, the sample has a low $T_c$. For example, the sample No. 26 in which y=0.7 has the $T_c$ as low as 40 K.

Figure 22:
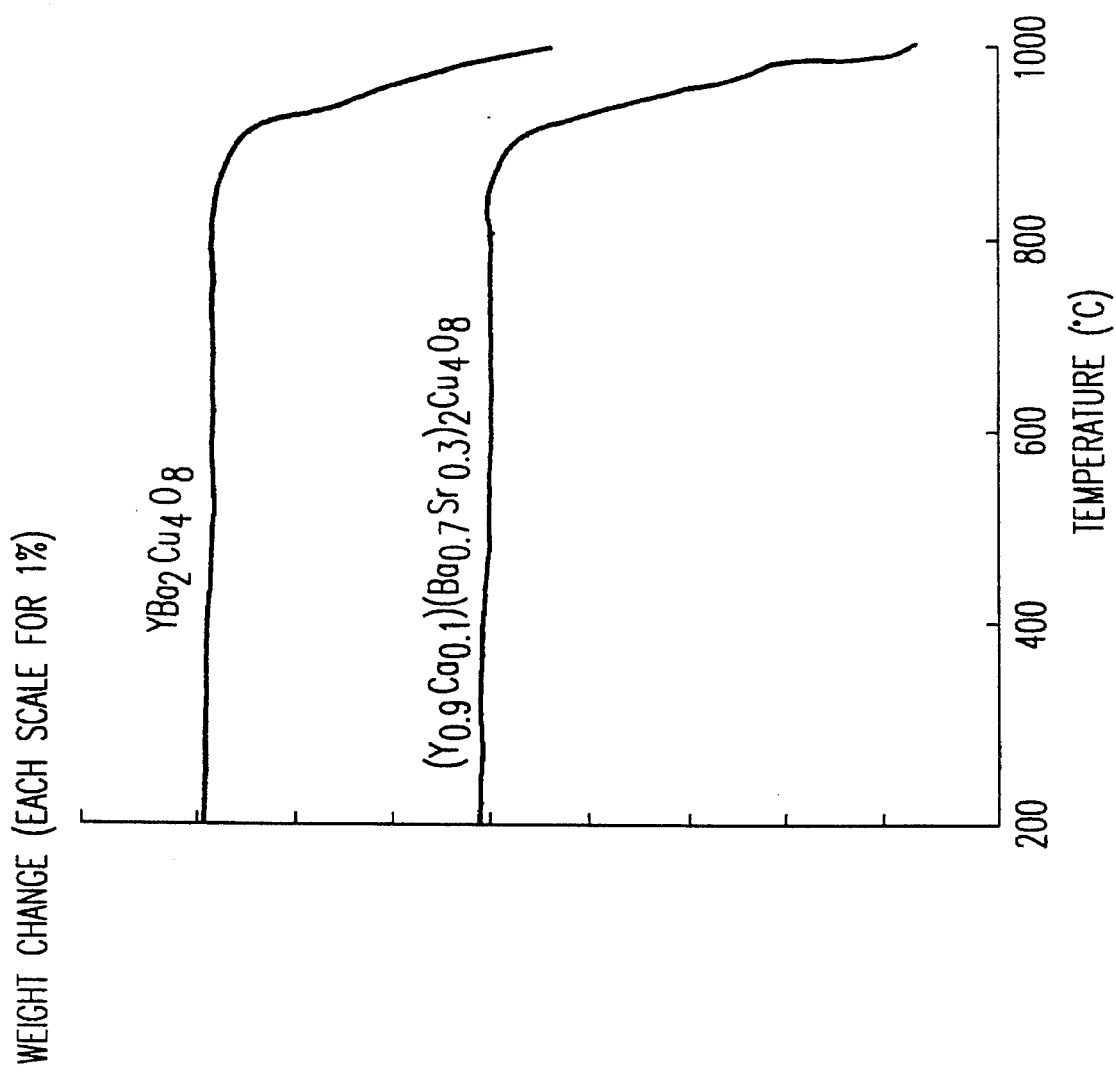
FIG. 22 is a graph showing the results of thermogravimetry of a sample in Example 10 which is represented by $(R_{1-x}Ca_x)(Ba_{1-y}Sr_y)_2Cu_4O_8$ (where x=0.1 and y=0.3).

Thermogravimetry performed on the sample in which x=0.1 and y=0.3 gave the results as shown in FIG. 22. It is noted that the sample remains unchanged in weight over the range from normal temperature to 850° C. and decreases in weight over the range from 850° C. to 900° C. These results suggest that the sample remains stable up to a temperature as high as 850° C. without absorption and liberation of oxygen, as in the case of the conventional oxide superconductor of $YBa_2Cu_4O_8$ type.

As explained above, the present invention provides oxide superconductors having the composition represented by $(R_{1-x}Ca_x)(Ba_{1-y}Sr_y)_2Cu_4O_8$ (where R denotes one of or any combination of Y, Nd, Sm, Eu, Gd, Dy, Ho, Er, and Tm; x is 0.001 to 0.3; and y is 0.001 to 0.6). All of them have the $T_c$ higher than 80 K. They remain stable up to about 850° C. without absorption and liberation of oxygen. They can be produced with as small a Ba content as 5.33 mol %. They can also be produced with cheap carbonates. This is a great advantage over the conventional oxide superconductor of $YBa_2Cu_4O_8$ type which contains as much Ba as 13.33 mol % (whose source is an expensive Ba nitrate) and hence needs special care in its production. According to the present invention, it is possible to produce, from a wider selection of materials, an improved oxide superconductor which contains a less amount of Ba (40% of the Ba content in the conventional one) and yet has the $T_c$ higher than 80 K.

TABLE 10 (1)

| Sample No. | Chemical Composition $(R_{1-x}Ca_x)(Ba_{1-y}Sr_y)_2Cu_4O_8$ | | | Starting materials |
| --- | --- | --- | --- | --- |
| | R | x | y | |
| 1 | Y | 0.001 | 0.001 | $Y_2O_3$, $CaCO_3$, $BaCO_3$, $SrCO_3$, CuO |
| 2 | Y:Er = 1:1 | 0.001 | 0.05 | $Y_2O_3$, $Er_2O_3$, $CaCO_3$, $BaCO_3$, $SrCO_3$, CuO |

TABLE 10 (1)-continued

| Sample No. | Chemical Composition $(R_{1-x}Ca_x)(Ba_{1-y}Sr_y)_2Cu_4O_8$ | | | Starting materials |
|---|---|---|---|---|
| | R | x | y | |
| 3 | Er | 0,001 | 0.1 | $Er_2O_3$, $CaCO_2$, $BaCO_3$, $SrCO_3$, CuO |
| 4 | Ho | 0.001 | 0.3 | $Ho_2O_3$, $CaCO_2$, $BaCO_3$, $SrCO_3$, CuO |
| 5 | Y | 0.001 | 0.6 | $Y_2O_3$, $CaCO_2$, $BaCO_3$, $SrCO_3$, CuO |
| 6 | Nd | 0.1 | 0.001 | $Nd_2O_3$, $CaCO_3$, $BaCO_3$, $SrCO_3$, CuO |
| 7 | Gd | 0.1 | 0.1 | $Gd_2O_3$, $CaCO_3$, $BaCO_3$, $SrCO_3$, CuO |
| 8 | Y | 0.1 | 0.3 | $Y_2O_3$, $CaCO_3$, $BaCO_3$, $SrCO_3$, CuO |
| 9 | Sm | 0.1 | 0.3 | $Sm_2O_3$, $CaCO_3$, $BaCO_3$, $SrCO_3$, CuO |
| 10 | Y:Eu = 1:1 | 0.1 | 0.4 | $Y_2O_3$, $Eu_2O_3$, $CaCO_3$, $BaCO_3$, $SrCO_3$, CuO |
| 11 | Dy | 0.1 | 0.6 | $Dy_2O_3$, $CaCO_3$, $BaCO_3$, $SrCO_3$, CuO |
| 12 | Tm | 0.3 | 0.001 | $Tm_2O_3$, $CaCO_3$, $BaCO_3$, $SrCO_3$, CuO |
| 13 | Er | 0.3 | 0.1 | $Er_2O_3$, $CaCO_3$, $BaCO_3$, $SrCO_3$, CuO |
| 14 | Y | 0.3 | 0.3 | $Y_2O_3$, $CaCO_3$, $BaCO_3$, $SrCO_3$, CuO |
| 15 | Y:Ho = 1:1 | 0.3 | 0.5 | $Y_2O_3$, $Ho_2O_3$, $CaCO_3$, $BaCO_3$, $SrCO_3$, CuO |
| 16 | Eu | 0.3 | 0.6 | $Eu_2O_3$, $CaCO_3$, $BaCO_3$, $SrCO_3$, CuO |
| 17 | Y | 0.0 | 0.0 | $Y_2O_3$, $Ba(NO_3)_2$, CuO |
| 18 | Nd | 0.0 | 0.0 | $Nd_2O_3$, $Ba(NO_3)_2$, CuO |
| 19 | Sm | 0.0 | 0.0 | $Sm_2O_3$, $Ba(NO_3)_2$, CuO |
| 20 | Eu | 0.0 | 0.0 | $Eu_2O_3$, $Ba(NO_3)_2$, CuO |
| 21 | Gd | 0.0 | 0.0 | $Gd_2O_3$, $Ba(NO_3)_2$, CuO |
| 22 | Dy | 0.0 | 0.0 | $Dy_2O_3$, $Ba(NO_3)_2$, CuO |
| 23 | Ho | 0.0 | 0.0 | $Ho_2O_3$, $Ba(NO_3)_2$, CuO |
| 24 | Er | 0.0 | 0.0 | $Er_2O_3$, $Ba(NO_3)_2$, CuO |
| 25 | Tm | 0.0 | 0.0 | $Tm_2O_3$, $Ba(NO_3)_2$, CuO |
| 26 | Y | 0.001 | 0.7 | $Y_2O_3$, $CaCO_3$, $BaCO_3$, $SrCO_3$, CuO |
| 27 | Eu | 0.1 | 0.7 | $Eu_2O_3$, $CaCO_3$, $BaCO_3$, $SrCO_3$, CuO |
| 28 | Y | 0.4 | 0.01 | $Y_2O_3$, $CaCO_3$, $BaCO_3$, $SrCO_3$, CuO |
| 29 | Sm | 0.4 | 0.7 | $Sm_2O_3$, $CaCO_3$, $BaCO_3$, $SrCO_3$, CuO |
| 30 | Gd | 0.3 | 0.7 | $Gd_2O_3$, $CaCO_3$, $BaCO_3$, $SrCO_3$, CuO |
| 31 | Y | 0.1 | 0.1 | $Y_2O_3$, $CaCO_3$, $BaCO_3$, $SrCO_3$, CuO |

TABLE 10 (2)

| Sample No. | Ba Content (mol %) | Calcination temp. (°C.) | Sintering temp. (°C.) | Phase | $T_c$ (K) | Remarks |
|---|---|---|---|---|---|---|
| 1 | 13.32 | 900 | 950 | $YBa_2Cu_4O_8$ | 83 | Example |
| 2 | 12.67 | 930 | 950 | $YBa_2Cu_4O_8$ | 83 | Example |
| 3 | 12.00 | 900 | 950 | $YBa_2Cu_4O_8$ | 83 | Example |
| 4 | 9.33 | 920 | 950 | $YBa_2Cu_4O_8$ | 83 | Example |
| 5 | 5.33 | 910 | 950 | $YBa_2Cu_4O_8$, $Y_2O_3$ | 82 | Example |
| 6 | 13.32 | 910 | 940 | $YBa_2Cu_4O_8$ | 85 | Example |
| 7 | 12.00 | 910 | 940 | $YBa_2Cu_4O_8$ | 85 | Example |
| 8 | 9.33 | 920 | 950 | $YBa_2Cu_4O_8$ | 84 | Example |
| 9 | 9.33 | 910 | 950 | $YBa_2Cu_4O_8$ | 85 | Example |
| 10 | 8.00 | 920 | 940 | $YBa_2Cu_4O_8$, $Y_2O_3$ | 83 | Example |
| 11 | 5.33 | 900 | 950 | $YBa_2Cu_4O_8$, $Y_2Cu_2O_5$ | 84 | Example |
| 12 | 13.32 | 900 | 950 | $YBa_2Cu_4O_8$, $BaCuO_2$ | 85 | Example |
| 13 | 12.00 | 900 | 950 | $YBa_2Cu_4O_8$, $BaCuO_2$ | 85 | Example |
| 14 | 9.33 | 920 | 950 | $YBa_2Cu_4O_8$, $BaCuO_2$ | 85 | Example |
| 15 | 6.67 | 900 | 930 | $YBa_2Cu_4O_8$, $BaCuO_2$ | 82 | Example |
| 16 | 5.33 | 920 | 950 | $YBa_2Cu_4O_8$, $BaCuO_2$, $Y_2Cu_2O_5$ | 84 | Example |
| 17 | 13.33 | 800 | 900 | $YBa_2Cu_4O_8$ | 82 | Compar. Example |
| 18 | 13.33 | 750 | 920 | $YBa_2Cu_4O_8$ | 82 | Compar. Example |
| 19 | 13.33 | 800 | 900 | $YBa_2Cu_4O_8$ | 82 | Compar. Example |
| 20 | 13.33 | 800 | 900 | $YBa_2Cu_4O_8$ | 82 | Compar. Example |
| 21 | 13.33 | 800 | 900 | $YBa_2Cu_4O_8$ | 82 | Compar. Example |
| 22 | 13.33 | 800 | 900 | $YBa_2Cu_4O_8$ | 83 | Compar. Example |
| 23 | 13.33 | 800 | 900 | $YBa_2Cu_4O_8$ | 83 | Compar. Example |
| 24 | 13.33 | 800 | 900 | $YBa_2Cu_4O_8$ | 81 | Compar. Example |
| 25 | 13.33 | 800 | 900 | $YBa_2Cu_4O_8$ | 81 | Compar. Example |
| 26 | 4.00 | 900 | 950 | $YBa_2Cu_4O_8$ | 40 | Compar. Example |

TABLE 10 (2)-continued

| Sample No. | Ba Content (mol %) | Calcination temp. (°C.) | Sintering temp. (°C.) | Phase | $T_c$ (K) | Remarks |
|---|---|---|---|---|---|---|
| 27 | 4.00 | 850 | 920 | $YBa_2Cu_4O_8$, $BaCuO_2$ | 40 | Compar. Example |
| 28 | 13.20 | 900 | 950 | $YBa_2Cu_4O_8$, $BaCuO_2$ | — | Compar. Example |
| 29 | 4.00 | 900 | 950 | $YBa_2Cu_4O_8$, $BaCuO_2$, $Sm_2O_3$ | — | Compar. Example |
| 30 | 4.00 | 850 | 910 | $YBa_2Cu_4O_8$, $BaCuO_2$, $Gd_2O_3$ | — | Compar. Example |
| 31 | 12.00 | 700 | 850 | $YBa_2Cu_3O_7$, $BaCO_3$, $Y_2BaCuO_6$ | — | Compar. Example |

Although the invention has been described in its preferred form with a certain degree of particularity, it is to be understood that the embodiments are illustrative only and not restrictive and the invention may be embodied in several forms without departing from the spirit and scope thereof. The oxide superconductor of the invention will find use as wiring and magnetic shield for low-temperature electronic apparatus.

What is claimed is:

1. A high-temperature oxide superconductor of the formula $$(R_{1-x}Ca_x)(Ba_{1-y}Sr_y)_2Cu_4O_8$$

wherein x is 0,

R is Nd or Sm, and y is 0.3.

2. A high-temperature oxide superconductor of the formula $$(R_{1-x}Ca_x)(Ba_{1-y}Sr_y)_2Cu_4O_8$$

wherein x is from 0 to 0.3, R is Nd or Sm, and y is 0.3.

* * * * *